(12) United States Patent
Ebisawa

(10) Patent No.: US 10,509,318 B2
(45) Date of Patent: Dec. 17, 2019

(54) CHEMICALLY AMPLIFIED POSITIVE-TYPE PHOTOSENSITIVE RESIN COMPOSITION, METHOD FOR MANUFACTURING SUBSTRATE WITH TEMPLATE, AND METHOD FOR MANUFACTURING PLATED ARTICLE

(71) Applicant: TOKYO OHKA KOGYO CO., LTD., Kawasaki-shi (JP)

(72) Inventor: Kazuaki Ebisawa, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 14 days.

(21) Appl. No.: 15/909,070

(22) Filed: Mar. 1, 2018

(65) Prior Publication Data
US 2018/0259853 A1 Sep. 13, 2018

(30) Foreign Application Priority Data
Mar. 10, 2017 (JP) .................... 2017-046765

(51) Int. Cl.
| | | |
|---|---|---|
| G03F 7/039 | (2006.01) | |
| G03F 7/004 | (2006.01) | |
| G03F 7/40 | (2006.01) | |
| G03F 7/16 | (2006.01) | |
| G03F 7/20 | (2006.01) | |
| G03F 7/027 | (2006.01) | |

(52) U.S. Cl.
CPC .......... *G03F 7/0392* (2013.01); *G03F 7/0045* (2013.01); *G03F 7/0275* (2013.01); *G03F 7/0397* (2013.01); *G03F 7/168* (2013.01); *G03F 7/20* (2013.01); *G03F 7/405* (2013.01)

(58) Field of Classification Search
CPC .......... G03F 7/0758; G03F 7/20; G03F 7/168; G03F 7/405
See application file for complete search history.

(56) References Cited

U.S. PATENT DOCUMENTS

| | | | | |
|---|---|---|---|---|
| 2006/0068324 A1* | 3/2006 | Mita | .................... | G03F 7/0392 430/270.1 |
| 2010/0203451 A1* | 8/2010 | Kato et al. | ............ | C08F 220/18 430/285.1 |
| 2015/0268553 A1* | 9/2015 | Katayama et al. | ... | G03F 7/0397 430/285.1 |

FOREIGN PATENT DOCUMENTS

| | | |
|---|---|---|
| JP | H09-176112 A | 7/1997 |
| JP | H11-052562 A | 2/1999 |

* cited by examiner

*Primary Examiner* — Cynthia Hamilton
(74) *Attorney, Agent, or Firm* — Knobbe, Martens, Olson & Bear LLP

(57) ABSTRACT

A chemically amplified positive-type photosensitive resin composition capable of suppressing the occurrence of "footing" in which the width of the bottom (the side proximate to the surface of a support) becomes narrower than that of the top (the side proximate to the surface of a resist layer) in a nonresist section and the occurrence of development residue, when a resist pattern serving as a template for a plated article is formed on a metal surface of a substrate using the composition; a method for manufacturing a substrate with a template using the composition; and a method for manufacturing a plated article using the substrate with the template. A mercapto compound having a specific structure is contained in the composition including an acid generator that generates an acid when irradiated with an active ray or radiation and a resin whose solubility in alkali increases under the action of acid.

6 Claims, 1 Drawing Sheet

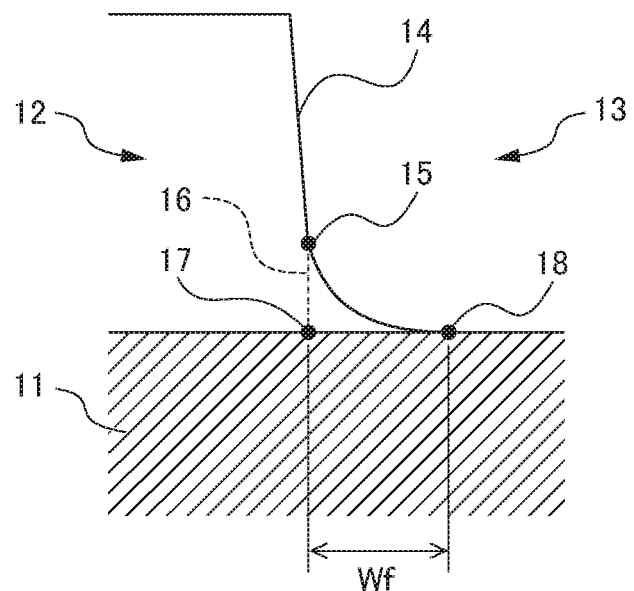

CHEMICALLY AMPLIFIED POSITIVE-TYPE PHOTOSENSITIVE RESIN COMPOSITION, METHOD FOR MANUFACTURING SUBSTRATE WITH TEMPLATE, AND METHOD FOR MANUFACTURING PLATED ARTICLE

This application claims priority to Japanese Patent Application No. 2017-046765, filed Mar. 10, 2017, the entire content of which is incorporated herein by reference.

BACKGROUND OF THE INVENTION

Field of the Invention

The present invention relates to a chemically amplified positive-type photosensitive resin composition, a method for manufacturing a substrate with a template by using the chemically amplified positive-type photosensitive resin composition, and a method for manufacturing a plated article by using the substrate with the template.

Related Art

Photofabrication is now the mainstream of a microfabrication technique. Photofabrication is a generic term describing the technology used for manufacturing a wide variety of precision components such as semiconductor packages. The manufacturing is carried out by applying a photoresist composition to the surface of a processing target to form a photoresist layer, patterning this photoresist layer using photolithographic techniques, and then conducting chemical etching, electrolytic etching, and/or electroforming based mainly on electroplating, using the patterned photoresist layer (photoresist pattern) as a mask.

In recent years, high density packaging technologies have progressed in semiconductor packages along with downsizing electronics devices, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that extend from peripheral terminals on the wafer and connect rewiring with the mounting terminals, are disposed on the surface of the substrate with high precision.

In the photofabrication as described above, a photoresist composition is used. Chemically amplified photoresist compositions containing an acid generator have been known as such a photoresist composition, (see Patent Documents 1, 2 and the like). According to the chemically amplified photoresist composition, an acid is generated from the acid generator upon irradiation with radiation (exposure) and diffusion of the acid is promoted through heat treatment, to cause an acid catalytic reaction with a base resin and the like in the composition resulting in a change to the alkali-solubility of the resin.

These chemically amplified positive-type photoresist compositions are used for forming, for example, plated articles such as bumps and metal posts by a plating process. Specifically, a photoresist layer having a desired thickness is formed on a support such as a metal substrate using a chemically amplified photoresist composition, and the photoresist layer is exposed through a predetermined mask pattern and then developed to form a photoresist pattern used as a template in which portions for forming bumps and metal posts have been selectively removed (stripped). Then, bumps and metal posts can be formed by embedding a conductor such as copper into the removed portions (non-resist sections) by plating, and then removing the surrounding residual photoresist pattern.

Patent Document 1: Japanese Unexamined Patent Application, Publication No. H09-176112
Patent Document 2: Japanese Unexamined Patent Application, Publication No. H11-52562

SUMMARY OF THE INVENTION

When forming connection terminals such as bumps and metal posts by the above plating process, the width of the bottom (the side proximate to the surface of a support) is desirably wider than that of the top (the side proximate to the surface of a resist layer) in a nonresist section of a resist pattern serving as a template. The contact area between the bottom surfaces of the connecting terminals such as bumps or metal posts and the support is thereby increased, and the adhesiveness between the connecting terminals and the support is thereby improved.

However, in a case where a resist pattern serving as a template for forming a bump, a metal post and the like is formed on a metal substrate with a conventionally known chemically amplified positive-type photoresist composition as disclosed in Patent Documents 1 and 2 and the like, a phenomenon called "footing" tends to occur in which the width of the bottom becomes narrower than that of the top in a nonresist section due to a protruded resist section toward the nonresist section at the contacting surface between the substrate surface and the resist pattern. For this reason, in a case where a conventionally known chemically amplified positive-type photoresist composition as disclosed in Patent Documents 1 and 2 and the like is used, a resist pattern having a nonresist section in which the width of the bottom is wider than that of the top is difficult to be formed on a metal substrate.

Furthermore, when a resist pattern serving as a template for plating is formed on a metal substrate using a chemically amplified positive-type photoresist composition, it is desired that a development residue is less likely to occur.

The present invention has been made in view of the above problem. An object of the present invention is to provide a chemically amplified positive-type photosensitive resin composition capable of suppressing the occurrence of "footing" in which the width of the bottom (the side proximate to the surface of a support) becomes narrower than that of the top (the side proximate to the surface of a resist layer) and occurrence of development residue in the nonresist section when a resist pattern serving as a template for a plated article is formed on a metal surface of a substrate by using the chemically amplified positive-type photosensitive resin composition. Another object of the present invention is to provide a method for manufacturing a substrate with a template by using the photosensitive resin composition. Still another object of the present invention is to provide a method for manufacturing a plated article using the substrate with a template.

After conducting extensive studies in order to achieve the above objects, the present inventors find that the above problem can be solved by including a mercapto compound with a specific structure in a chemically amplified positive-type photosensitive resin composition. Then, the present inventors have completed the present invention. Specifically, the present invention provides the following.

A first aspect of the present invention is a chemically amplified positive-type photosensitive resin composition, containing an acid generator (A) that generates an acid when irradiated with an active ray or radiation, a resin (B) whose solubility in alkali increases under the action of acid, and a mercapto compound (C) represented by the following formula (C1):

[Formula 1]

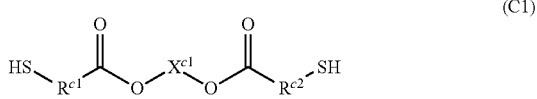
(C1)

(in the formula (C1), $R^{c1}$ and $R^{c2}$ each independently represent a divalent organic group, the $R^{c1}$ and $R^{c2}$ are bonded to a carbonyl group by a C—C bond, and bonded to a mercapto group by a C—S bond, $X^{c1}$ is a divalent organic group represented by the following formula (C1-1):

[Formula 2]

(C1-1)

in the formula (C1-1), $R^{c3}$, $R^{c4}$, $R^{c5}$, and $R^{c6}$ each independently represent a hydrocarbon group which may have a substituent, $R^{c3}$ and $R^{c5}$ may be bonded to a carbon atom in $Y^{c1}$ to form a ring, $Y^{c1}$ is a divalent organic group bonded, by a C—C bond, to a carbon atom to which $R^{c3}$ and $R^{c4}$ are bonded and to a carbon atom to which $R^{c5}$ and $R^{c6}$ are bonded, respectively).

A second aspect of the present invention is a method for manufacturing a substrate with a template, the method including: laminating a photosensitive resin layer on a metal surface of a substrate, the photosensitive resin layer including the chemically amplified positive-type photosensitive resin composition according to the first aspect; irradiating the photosensitive resin layer with an active ray or radiation to perform exposure; and developing the photosensitive resin layer after the exposure to create a template for forming a plated article.

A third aspect of the present invention is a method for manufacturing a plated article, the method including plating the substrate with the template manufactured by the method according to the second aspect so as to form the plated article in the template.

The present invention can provide a chemically amplified positive-type photosensitive resin composition capable of suppressing the occurrence of "footing" in which the width of the bottom (the side proximate to the surface of a support) becomes narrower than that of the top (the side proximate to the surface of a resist layer) in a nonresist section, and generation of development residues, when a resist pattern serving as a template for a plated article is formed on a metal surface of a substrate by using the chemically amplified positive-type photosensitive resin composition; a method for manufacturing a substrate with a template by using the above photosensitive resin composition; and a method for manufacturing a plated article using the above substrate with the template.

BRIEF DESCRIPTION OF THE DRAWINGS

FIG. 1 shows schematically illustrated cross-sections of resist patterns observed when measuring the amount of footing at nonresist sections in the resist patterns in Examples and Comparative Examples.

DETAILED DESCRIPTION OF THE INVENTION

Chemically Amplified Positive-Type Photosensitive Resin Composition

A chemically amplified positive-type photosensitive resin composition (hereinafter also referred to as a photosensitive resin composition) contains an acid generator (A) that generates an acid when irradiated with an active ray or radiation (hereinafter also referred to as an acid generator (A)), a resin (B) whose solubility in alkali increases under the action of acid (hereinafter also referred to as a resin (B)) and a mercapto compound (C) having a predetermined structure. The photosensitive resin composition may include a component such as an alkali soluble resin (D), an acid diffusion suppressing agent (E) and an organic solvent (S), and the like, if necessary.

There is no particular limitation for the thickness of a resist pattern formed with the photosensitive resin composition. The photosensitive resin composition is preferably used for forming a thick resist pattern. The thickness of a resist pattern formed with the photosensitive resin composition is preferably 10 μm or more, more preferably 10 μm or more and 150 μm or less, particularly preferably 20 μm or more and 120 μm or less, and most preferably 20 μm or more and 80 μm or less.

Below, described are essential or optional components in the photosensitive resin composition, and a method for manufacturing the photosensitive resin composition.

Acid Generator (A)

The acid generator (A) is a compound capable of producing an acid when irradiated with an active ray or radiation, and is not particularly limited as long as it is a compound which directly or indirectly produces an acid under the action of light. The acid generator (A) is preferably any one of the acid generators of the first to fifth aspects that will be described below. Hereinafter, suitable examples among the acid generator (A)s that are suitably used in photosensitive resin compositions will be described as the first to fifth aspects.

The first aspect of the acid generator (A) may be a compound represented by the following formula (a1).

[Formula 3]

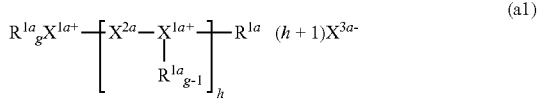
(a1)

In the formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 or more and 30 or less carbon atoms, 30 carbon atoms, a heterocyclic group having 4 or more and 30 or less carbon atoms, an alkyl group having 1 or more and 30 or less carbon atoms, an alkenyl group having 2 or more and 30 or less carbon atoms, or an alkynyl group having 2 or more and 30 or less carbon atoms, and $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 or more and 3 or less carbon atoms, or a phenylene group, and may form a ring structure containing $X^{1a}$. $R^{2a}$ represents an alkyl group having 1 or more and 5 or less carbon atoms, or an aryl group having 6 or more and 10 or less carbon atoms.

$X^{2a}$ represents a structure represented by the following formula (a2).

[Formula 4]

—X$^{4a}$—[X$^{5a}$—X$^{4a}$]$_h$      (a2)

In the formula (a2) $X^{4a}$ represents an alkylene group having 1 or more and 8 or less carbon atoms, an arylene group having 6 or more and 20 or less carbon atoms, or a divalent group of a heterocyclic compound having 8 or more and 20 or less carbon atoms, and $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 to 3 carbon atoms, or a phenylene group. h represents the number of repeating units of the structure in parentheses. $X^{4a}$s in the number of h+1 and $X^{5a}$s in the number of h may be identical to or different from each other. $R^{2a}$ has the same definition as described above.

$X^{3a}$ represents a counterion of an onium, and examples thereof include a fluorinated alkylfluorophosphoric acid anion represented by the following formula (a17) or a borate anion represented by the following formula (a18).

[Formula 5]

[(R$^{3a}$)$_j$PF$_{6-j}$]$^-$      (a17)

In the formula (a17), $R^{3a}$ represents an alkyl group having 80% or more of the hydrogen atoms substituted with fluorine atoms. j represents the number of $R^{3a}$s and is an integer from 1 or more and 5 or less. $R^{3a}$s in the number of j may be respectively identical to or different from each other.

[Formula 6]

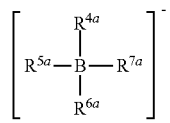

(a18)

In the formula (a18), $R^{4a}$ to $R^{7a}$ each independently represents a fluorine atom or a phenyl group, and a part or all of the hydrogen atoms of the phenyl group may be substituted with at least one selected from the group consisting of a fluorine atom and a trifluoromethyl group.

Examples of the onium ion in the compound represented by the formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl} sulfide, 4-(4-benzoyl-2-chlorophenylthio)phenylbis(4-fluorophenyl)sulfonium, 7-isopropyl-9-oxo-10-thia-9,10-dihydroanthracene-2-yldi-p-tolylsulfonium, 7-isopropyl-9-oxo-10-thia-9,10-dihydroanthracene-2-yldiphenylsulfonium, 2-[(diphenyl)sulfonio]thioxanthone, 4-[4-(4-tert-butylbenzoyl)phenylthio] phenyldi-p-tolylsulfonium, 4-(4-benzoylphenylthio) phenyldiphenylsulfonium, diphenylphenacylsulfonium, 4-hydroxyphenylmethylbenzylsulfonium, 2-naphthylmethyl (1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl (p-tolyl)iodonium.

Among the onium ions in the compound represented by the formula (a1), a preferred onium ion may be a sulfonium ion represented by the following formula (a19).

[Formula 7]

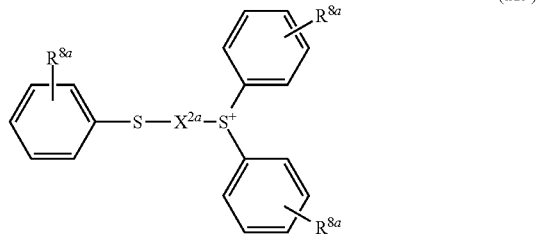

(a19)

In the formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the formula (a1).

Specific examples of the sulfonium ion represented by the formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, and diphenyl[4-(p-terphenylthio) phenyl]diphenylsulfonium.

In regard to the fluorinated alkylfluorophosphoric acid anion represented by the formula (a17), $R^{3a}$ represents an alkyl group substituted with a fluorine atom, and a preferred number of carbon atoms is 1 or more and 8 or less, while a more preferred number of carbon atoms is 1 or more and 4 or less. Specific examples of the alkyl group include linear alkyl groups such as methyl, ethyl, propyl, butyl, pentyl and octyl; branched alkyl groups such as isopropyl, isobutyl, sec-butyl and tert-butyl; and cycloalkyl groups such as cyclopropyl, cyclobutyl, cyclopentyl, and cyclohexyl. The proportion of hydrogen atoms substituted with fluorine atoms in the alkyl groups is usually 80% or more, preferably 90% or more, and even more preferably 100%. If the substitution ratio of fluorine atoms is less than 80%, the acid strength of the onium fluorinated alkylfluorophosphate represented by the formula (a1) decreases.

A particularly preferred example of $R^{3a}$ is a linear or branched perfluoroalkyl group having 1 or more and 4 or less carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which as the number of $R^{3a}$s represents an integer from 1 or more and 5 or less, preferably 2 or more and 4 or less, and particularly preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[CF_3CF_2CF_2CF_2)_2PF_4]^-$, and $[(CF_3CF_2CF_2)_3PF_3]^-$. Among these, $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are particularly preferred.

Preferred specific examples of the borate anion represented by the formula (a18) include tetrakis(pentafluorophenyl)borate ($[B(C_6F_5)_4]^-$), tetrakis[(trifluoromethyl)phenyl]borate ($[B(C_6H_4CF_3)_4]^-$), difluorobis(pentafluorophenyl)borate ($[(C_6F_5)_2BF_2]^-$), trifluoro(pentafluorophenyl)borate ($[(C_6F_5)BF_3]^-$), and tetrakis(difluorophenyl)borate ($[B(C_6H_3F_2)_4]^-$). Among these, tetrakis(pentafluorophenyl)borate ($[B(C_6F_5)_4]^-$) is particularly preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine and tris(2,3-dibromopropyl)-1,3,5-triazine, and halogen-containing triazine compounds represented by the following formula (a3) such as tris(2,3-dibromopropyl)isocyanurate.

[Formula 8]

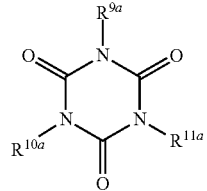

(a3)

In the formula (a3), $R^{9a}$, $R^{10a}$ and $R^{11a}$ each independently represent a halogenated alkyl group.

Further, the third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile and α-(ethylsulfonyloxyimino)-1-cyclopentenylacetonitrile, and compounds represented by the following formula (a4) having an oximesulfonate group.

[Formula 9]

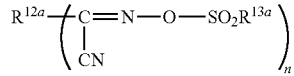

(a4)

In the formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group may be exemplified. These may have one or more appropriate substituents such as halogen atoms, alkyl groups, alkoxy groups and nitro groups on the rings. It is particularly preferable that $R^{13a}$ is an alkyl group having 1 or more and 6 or less carbon atoms such as a methyl group, an ethyl group, a propyl group, and a butyl group. In particular, compounds in which $R^{12a}$ represents an aromatic compound group, and $R^{13a}$ represents an alkyl group having 1 or more and 4 or less carbon atoms are preferred.

Examples of the acid generator represented by the formula (a4), include compounds in which $R^{12a}$ is any one of a phenyl group, a methylphenyl group and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene] (o-tolyl)acetonitrile and the like. Provided that n is 2, the acid generator represented by the formula (a4) is specifically an acid generator represented by the following formulae.

[Formula 10]

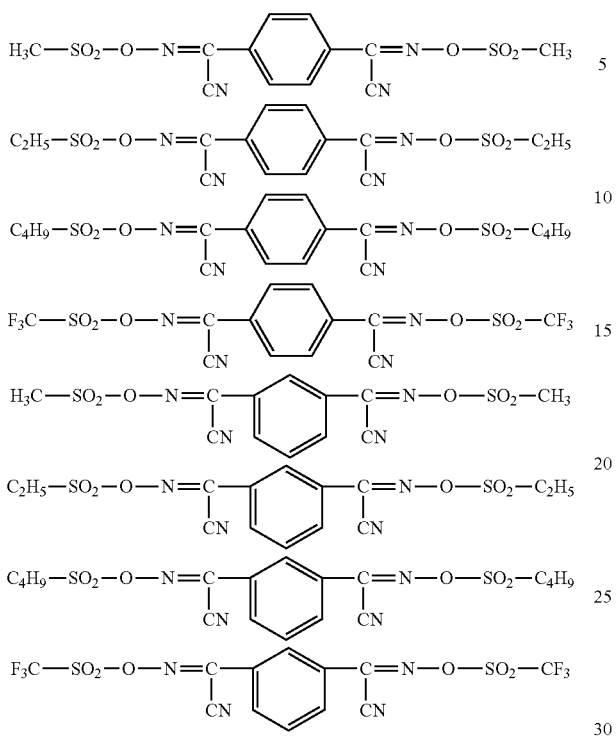

In addition, the fourth aspect of the acid generator (A) include onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, a linear or branched alkoxy group having 1 or more and 6 or less carbon atoms or the like. The structure derived from the naphthalene ring, which may be of a monovalent group (one free valance) or of a bivalent group (two free valences), is desirably of a monovalent group (in this regard, the number of free valance is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

[Formula 11]

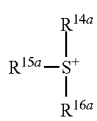

(a5)

In the formula (a5), at least one of $R^{14a}$, $R^{15a}$ and $R^{16a}$ represents a group represented by the following formula (a6), and the remaining represents a linear or branched alkyl group having 1 or more and 6 or less carbon atoms, a phenyl group which may have a substituent, a hydroxyl group, or a linear or branched alkoxy group having 1 or more and 6 or less carbon atoms. Alternatively, one of $R^{14a}$, $R^{15a}$ and $R^{16a}$ is a group represented by the following formula (a6), and the remaining two are each independently a linear or branched alkylene group having 1 or more and 6 or less carbon atoms, and these terminals may bond to form a ring structure.

[Formula 12]

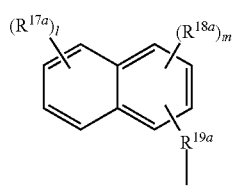

(a6)

In the formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 carbon atoms, and $R^{19a}$ represents a single bond or a linear or branched alkylene group having 1 or more and 6 or less carbon atoms which may have a substituent. l and m each independently represent an integer of 0 or more and 2 or less, and l+m is no greater than 3. In this regard, when there exists a plurality of $R^{17a}$, they may be identical or different from each other. Furthermore, when there exist a plurality of $R^{18a}$, they may be identical or different from each other.

Preferably, among $R^{14a}$, $R^{15a}$ and $R^{16a}$ as above, the number of groups represented by the formula (a6) is one in view of the stability of the compound, and the remaining are linear or branched alkylene groups having 1 or more and 6 or less carbon atoms of which the terminals may bond to form a ring. In this case, the two alkylene groups described above form a 3 to 9 membered ring including sulfur atom(s). Preferably, the number of atoms to form the ring (including sulfur atom(s)) is 5 or 6.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 or more and 6 or less carbon atoms, linear or branched alkyl groups having 1 or more and 6 or less carbon atoms, or the like.

Examples of suitable cation moiety include those represented by the following formulae (a7) and (a8), and the structure represented by the following formula (a8) is particularly preferable.

[Formula 13]

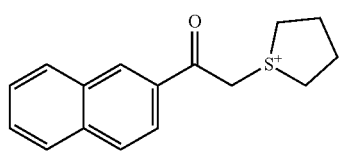

(a7)

-continued (a8)

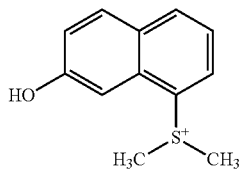

The cation moieties may be of an iodonium salt or a sulfonium salt, and are desirably of a sulfonium salt in view of acid-producing efficiency.

It is, therefore, desirable that the preferable anion moiety of the onium salt having a naphthalene ring at the cation moiety is an anion capable of forming a sulfonium salt.

The anion moiety of the acid generator is exemplified by fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 or more and 20 or less carbon atoms. Preferably, the carbon number is 1 or more and 10 or less in view of bulkiness and diffusion distance of the produced acid. In particular, branched or cyclic groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 or more and 20 or less carbon atoms, and is exemplified by a phenyl group or a naphthyl group that may be unsubstituted or substituted with an alkyl group or a halogen atom. In particular, aryl groups having 6 or more and 10 or less carbon atoms are preferred since they can be synthesized inexpensively. Specific examples of preferable aryl group include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% or more and 100% or less, and more preferably 50% or more and 100% or less; it is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

[Formula 14]

$$R^{20a}SO_3^-  \qquad (a9)$$

In the formula (a9), $R^{20a}$ represents a group represented by the following formulae (a10), (a11), and (a12).

[Formula 15]

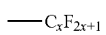  (a10)

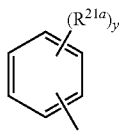  (a11)

-continued (a12)

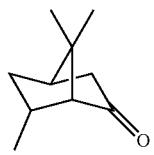

In the formula (a10), x represents an integer of 1 or more and 4 or less. Also, in the formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Among them, trifluoromethane sulfonate, and perfluorobutane sulfonate are preferable in view of safety.

In addition, a nitrogen-containing moiety represented by the following formula (a13) or (a14) may be also be used for the anion moiety.

[Formula 16]

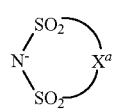  (a13)

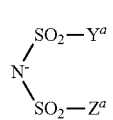  (a14)

In the formulae (a13) and (a14), $X^a$ represents a linear or branched alkylene group of which at least one hydrogen atom is substituted with a fluorine atom, the carbon number of the alkylene group is 2 or more and 6 or less, preferably 3 or more and 5 or less, and most preferably the carbon number is 3. In addition, $Y^a$ and $Z^a$ each independently represent a linear or branched alkyl group of which at least one hydrogen atom is substituted with a fluorine atom, the number of carbon atoms of the alkyl group is 1 or more and 10 or less, preferably 1 or more and 7 or less, and more preferably 1 or more and 3 or less.

The smaller number of carbon atoms in the alkylene group of $X^a$, or in the alkyl group of $Y^a$ or $Z^a$ is preferred since the solubility into organic solvent is favorable.

In addition, a larger number of hydrogen atoms each substituted with a fluorine atom in the alkylene group of $X^a$, or in the alkyl group of $Y^a$ or $Z^a$ is preferred since the acid strength becomes greater. The percentage of fluorine atoms in the alkylene group or alkyl group, i.e., the fluorination rate is preferably 70% or more and 100% or less and more preferably 90% or more and 100% or less, and most preferable are perfluoroalkylene or perfluoroalkyl groups in which all of the hydrogen atoms are each substituted with a fluorine atom.

Preferable onium salts having a naphthalene ring at their cation moieties are exemplified by compounds represented by the following formulae (a15) and (a16).

[Formula 17]

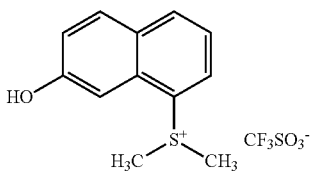
(a15)

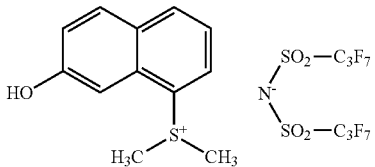
(a16)

Also, the fifth aspect of the (A) acid generator include bissulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-methylsulfonyloxysuccinimide, N-trichloromethylsulfonyloxysuccinimide, N-phenylsulfonyloxymaleimide and N-methylsulfonyloxyphthalimide; trifluoromethane sulfonates such as N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates and the like.

This acid generator (A) may be used alone, or two or more types may be used in combination. Furthermore, the content of the acid generator (A) is preferably adjusted to 0.1% by mass or more and 10% by mass or less, and more preferably 0.5% by mass or more and 3% by mass or less, relative to the total mass of the photosensitive resin composition. When the amount of the acid generator (A) used is adjusted to the range described above, a photosensitive resin composition that is a uniform solution having satisfactory sensitivity and exhibiting excellent storage stability can be readily prepared.

Resin (B)

The resin (B) whose alkali solubility increases by the action of an acid is not particularly limited, and an arbitrary resin whose alkali solubility increases by the action of an acid may be used. Of these, at least one resin selected from the group consisting of novolak resin (B1), polyhydroxystyrene resins (B2) and acrylic resin (B3) is preferably contained.

[Novolak Resin (B1)]

As the novolak resin (B1), a resin including the structural unit represented by the following formula (b1) may be used.

[Formula 18]

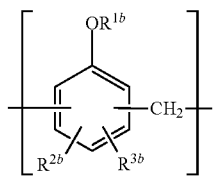
(b1)

In the formula (b1), $R^{1b}$ represents an acid-dissociative dissolution-controlling group, and $R^{2b}$ and $R^{3b}$ each independently represent a hydrogen atom or an alkyl group having 1 or more and 6 or less carbon atoms.

The acid-dissociative dissolution-controlling group represented by the above $R^{1b}$ is preferably a group represented by the following formula (b2) or (b3), a linear, branched or cyclic alkyl group having 1 or more and 6 or less carbon atoms, a vinyloxyethyl group, a tetrahydropyranyl group, a tetrahydrofuranyl group, or a trialkylsilyl group.

[Formula 19]

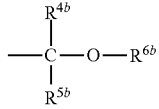
(b2)

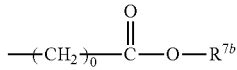
(b3)

In the formulae (b2) and (b3), $R^{4b}$ and $R^{5b}$ each independently represent a hydrogen atom, or a linear or branched alkyl group having 1 or more and 6 or less carbon atoms, $R^{6b}$ represents a linear, branched or cyclic alkyl group having 1 or more and 10 or less carbon atoms, $R^{7b}$ represents a linear, branched or cyclic alkyl group having 1 or more and 6 or less carbon atoms, and o represents 0 or 1.

Examples of the linear or branched alkyl group include a methyl group, an ethyl group, a propyl group, an isopropyl group, a n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociative dissolution-controlling group represented by the formula (b2) include a methoxyethyl group, ethoxyethyl group, n-propoxyethyl group, isopropoxyethyl group, n-butoxyethyl group, isobutoxyethyl group, tert-butoxyethyl group, cyclohexyloxyethyl group, methoxypropyl group, ethoxypropyl group, 1-methoxy-1-methylethyl group, 1-ethoxy-1-methylethyl group, and the like. Furthermore, specific examples of the acid-dissociative dissolution-controlling group represented by the formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 or more and 6 or less carbon atoms.

[Polyhydroxystyrene Resin (B2)]

As the polyhydroxystyrene resin (B2), a resin including the structural unit represented by the following formula (b4) may be used.

[Formula 20]

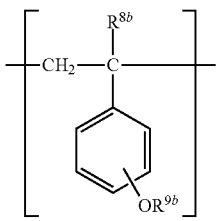

(b4)

In the formula (b4), $R^{8b}$ represents a hydrogen atom or an alkyl group having 1 or more and 6 or less carbon atoms, and $R^{9b}$ represents an acid-dissociative dissolution-controlling group.

The alkyl group having 1 to 6 carbon atoms may include, for example, linear, branched or cyclic alkyl groups having 1 or more and 6 or less carbon atoms. Examples of the linear or branched alkyl group include a methyl group, ethyl group, propyl group, isopropyl group, n-butyl group, isobutyl group, tert-butyl group, pentyl group, isopentyl group and neopentyl group, and examples of the cyclic alkyl group include a cyclopentyl group and cyclohexyl group.

The acid-dissociative dissolution-controlling group represented by the above $R^{9b}$ may be similar to the acid-dissociative dissolution-controlling groups exemplified in terms of the above formulae (b2) and (b3).

Furthermore, the polyhydroxystyrene resin (B2) may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid 2-methacryloyloxyethyl phthalic acid and 2-methacryloyloxyethyl hexahydrophthalic acid; (meth)acrylic acid alkyl esters such as methyl(meth)acrylate, ethyl (meth)acrylate and butyl (meth) acrylate; (meth)acrylic acid hydroxyalkyl esters such as 2-hydroxyethyl (meth)acrylate and 2-hydroxypropyl (meth) acrylate; (meth)acrylic acid aryl esters such as phenyl (meth) acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide.

[Acrylic Resin (B3)]

The acrylic resin (B3) is not particularly limited as long as it is an acrylic resin whose solubility in alkali is increased under the action of acid, and which has conventionally been blended in various photosensitive resin compositions. Preferably, the acrylic resin (B3) contains, for example, a constituent unit (b-3) derived from acrylic ester including a cyclic group containing —$SO_2$— or a lactone-containing cyclic group. In such a case, when a resist pattern is formed, the occurrence of footing is easily suppressed.

(Cyclic Group Containing —$SO_2$—)

Herein, the "cyclic group containing —$SO_2$—" denotes a cyclic group containing a ring including —$SO_2$— in a ring skeleton thereof. Specifically, it is a cyclic group in which a sulfur atom (S) in —$SO_2$— forms a part of the ring skeleton of the cyclic group. A ring including —$SO_2$— in a ring skeleton thereof is counted as a first ring, when only this ring is included, the ring is referred to as a monocyclic group and when other ring structures are included, regardless of the structure, the ring is referred to as a polycyclic group. The cyclic group containing —$SO_2$— may be monocyclic or may be polycyclic.

It is preferable that the cyclic group containing —$SO_2$— is a cyclic group including —O—$SO_2$— in the ring skeleton thereof, that is, a cyclic group containing a sultone ring in which —O—S— in —O—$SO_2$— forms a part of the ring skeleton.

The number of carbon atoms of the cyclic group containing —$SO_2$— is preferably 3 or more and 30 or less, more preferably 4 or more and 20 or less, further preferably 4 or more and 15 or less, and particularly preferably 4 or more and 12 or less. The number of carbon atoms is a number of carbon atoms constituting a ring skeleton, and does not include the number of carbon atoms in a substituent.

The cyclic group containing —$SO_2$— may be an aliphatic cyclic group containing —$SO_2$—, or may be an aromatic cyclic group containing —$SO_2$—. The cyclic group containing —$SO_2$— is preferably an aliphatic cyclic group containing —$SO_2$—.

Examples of the aliphatic cyclic group containing —$SO_2$— include a group obtained by removing at least one hydrogen atom from an aliphatic hydrocarbon ring in which a part of the carbon atoms constituting a ring skeleton is substituted with —$SO_2$— or —O—$SO_2$—. More specific examples thereof include a group obtained by removing at least one hydrogen atom from an aliphatic hydrocarbon ring in which —$CH_2$— constituting the ring skeleton is substituted with —$SO_2$—, and a group obtained by removing at least one hydrogen atom from an aliphatic hydrocarbon ring in which —$CH_2$—$CH_2$— constituting the ring is substituted with —O—$SO_2$—, and the like.

The number of carbon atoms of the alicyclic hydrocarbon ring is preferably 3 or more and 20 or less, and more preferably 3 or more and 12 or less. The alicyclic hydrocarbon ring may be polycyclic, or may be monocyclic. As the monocyclic alicyclic hydrocarbon group, a group obtained by removing two hydrogen atoms from monocycloalkane having 3 or more and 6 or less carbon atoms is preferable. Examples of the monocycloalkane can include cyclopentane, cyclohexane, and the like. As the polycyclic alicyclic hydrocarbon ring, a group obtained by removing two hydrogen atoms from polycycloalkane having 7 or more and 12 or less carbon atoms is preferable. Specific examples of the polycycloalkane include adamantane, norbornane, isobornane, tricyclodecane, tetracyclododecane, and the like.

The cyclic group containing —$SO_2$— may have a substituent. Examples of the substituent include an alkyl group, an alkoxy group, a halogen atom, an alkyl halide group, a hydroxyl group, an oxygen atom (=O), —COOR", —OC(=O)R", a hydroxy alkyl group, a cyano group, and the like.

As the alkyl group as a substituent, an alkyl group having 1 or more and 6 or less carbon atoms is preferable. The alkyl group is preferably linear or branched alkyl group. Specific examples thereof include a methyl group, an ethyl group, an n-propyl group, an isopropyl group, an n-butyl group, an isobutyl group, a tert-butyl group, an n-pentyl group, an isopentyl group, a neopentyl group, an n-hexyl, and the like. Among them, a methyl group or an ethyl group is preferable, and a methyl group is particularly preferable.

As the alkoxy group as a substituent, an alkoxy group having 1 or more and 6 or less carbon atoms is preferable. The alkoxy group is preferably linear or branched alkoxy group. Specific examples thereof include a group in which an alkyl group is bonded to an oxygen atom (—O—) described as an example of an alkyl group as the substituent mentioned above.

Examples of the halogen atom as the substituent include a fluorine atom, a chlorine atom, a bromine atom, an iodine atom, and the like. A fluorine atom is preferable.

Examples of the alkyl halide group as the substituent include a group in which a part or all of the hydrogen atoms of the alkyl group are substituted with the halogen atom.

Examples of the alkyl halide group as the substituent include a group in which hydrogen atoms of the alkyl group described as an example of a substituent is partially or entirely substituted with the halogen atom. As the alkyl halide group, a fluorinated alkyl group is preferable, and a perfluoroalkyl group is particularly preferable.

R" in both of the above-mentioned —COOR" and —OC(=O)R" is a hydrogen atom or a linear, branched or cyclic alkyl group having 1 or more and 15 or less carbon atoms.

When R" is a linear or branched alkyl group, the number of carbon atoms of the chain alkyl group is preferably 1 or more and 10 or less, more preferably 1 or more and 5 or less, and particularly preferably 1 or 2.

When R" is a cyclic alkyl group, the number of carbon atoms of the cyclic alkyl group is preferably 3 or more and 15 or less, more is preferably 4 or more and 12 or less, and particularly preferably 5 or more and 10 or less. Specific examples thereof include a group in which one or more hydrogen atoms are removed from monocycloalkane, and which may be substituted with a fluorine atom or a fluorinated alkyl group, or may not be substituted, and polycycloalkane such as bicycloalkane, tricycloalkane and tetracycloalkane. More specific examples thereof include a group in which one or more hydrogen atoms are removed from monocycloalkane such as cyclopentane and cyclohexane, and polycycloalkane such as adamantane, norbornane, isobornane, tricyclodecane, and tetracyclododecane.

As the hydroxy alkyl group of the substituent, a hydroxy alkyl group having 1 or more and 6 or less carbon atoms is preferable. Specific examples thereof include a group in which at least one hydrogen atom of the alkyl group described as an example of the substituent is substituted with a hydroxyl group.

More specific examples of the cyclic group containing —SO₂— include groups represented by the following formulae (3-1) to (3-4).

[Formula 21]

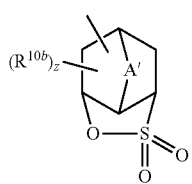
(3-1)

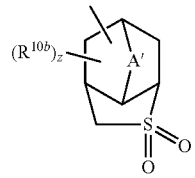
(3-2)

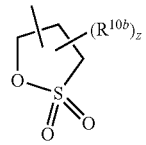
(3-3)

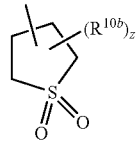
(3-4)

(In the formula, A' represents an alkylene group having 1 or more and 5 or less carbon atoms, which may include an oxygen atom or a sulfur atom, an oxygen atom or a sulfur atom, z is an integer of 0 or more and 2 or less, $R^{10b}$ represents an alkyl group, an alkoxy group, an alkyl halide group, a hydroxyl group, —COOR", —OC(=O)R", a hydroxy alkyl group, or a cyano group, and R" represents a hydrogen atom, or an alkyl group.)

In the above formulae (3-1) to (3-4), A' represents an alkylene group having 1 or more and 5 or less carbon atoms, which may include an oxygen atom (—O—) or a sulfur atom (—S—), an oxygen atom, or a sulfur atom. As the alkylene group having 1 or more and 5 or less carbon atoms in A', a linear or branched alkylene group is preferable, and examples thereof include a methylene group, an ethylene group, n-propylene group, and an isopropylene group, and the like.

When the alkylene group is an oxygen atom or a sulfur atom, specific examples thereof include groups in which —O—, or —S— are interposed at the terminal of the alkylene group or between carbon atoms, and include, for example, O—CH₂—, —CH₂—O—CH₂—, —S—CH₂—, —CH₂—S—CH₂—, or the like. As A', an alkylene group having 1 or more and 5 or less carbon atoms, or —O— is preferable, an alkylene group having 1 or more and 5 or less carbon atoms is more preferable, and a methylene group is the most preferable.

Z may be any of 0 or more and 2 or less, and 0 is the most preferable. When z is 2, a plurality of $R^{10b}$ may be the same as or different from each other.

An alkyl group, an alkoxy group, an alkyl halide group, —COOR", —OC(=O)R", and a hydroxy alkyl group in $R^{10b}$ may be respectively the same as the alkyl group, alkoxy group, alkyl halide group, —COOR", —OC(=O)R", and hydroxy alkyl group described as an examples of the substituent which may be included in the cyclic group containing —SO₂—.

Hereinafter, specific cyclic groups represented by the above formulae (3-1) to (3-4) are described. Note here that "Ac" in the formula represents an acetyl group.

[Formula 22]
(3-1-1) 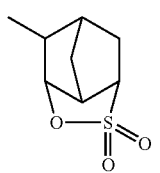
(3-1-2) 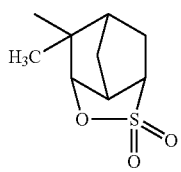
(3-1-3) 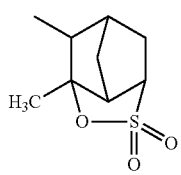
(3-1-4) 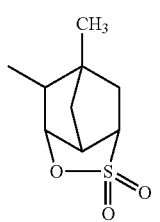
(3-1-5) 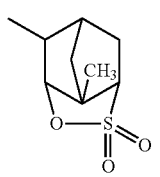
(3-1-6) 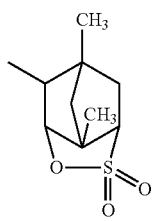
(3-1-7) 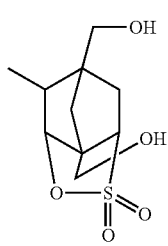
-continued
(3-1-8) 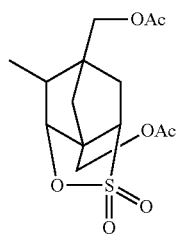
(3-1-9) 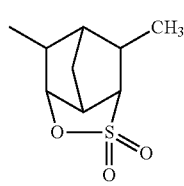
(3-1-10) 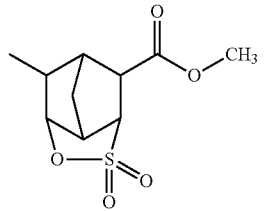
(3-1-11) 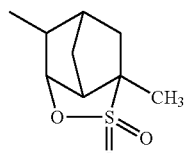
(3-1-12) 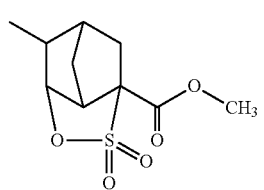
(3-1-13) 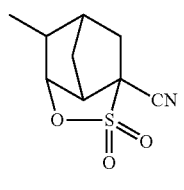
(3-1-14) 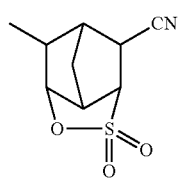
(3-1-15) 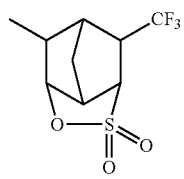

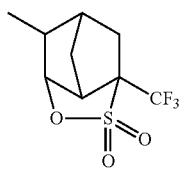 (3-1-16)
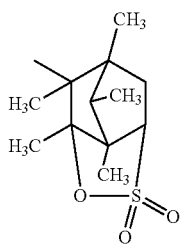 (3-1-17)
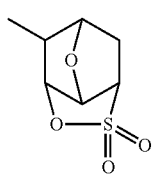 (3-1-18)
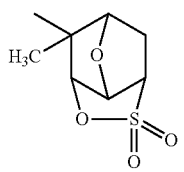 (3-1-19)
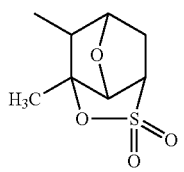 (3-1-20)
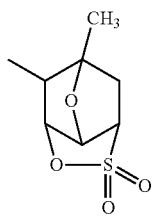 (3-1-21)
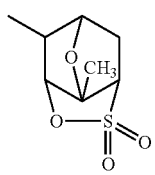 (3-1-22)
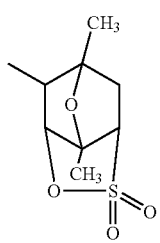 (3-1-23)
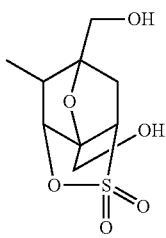 (3-1-24)
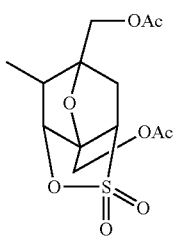 (3-1-25)
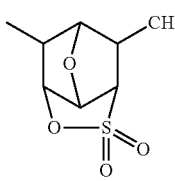 (3-1-26)
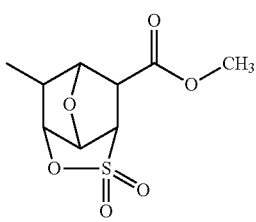 (3-1-27)
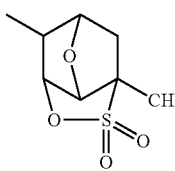 (3-1-28)
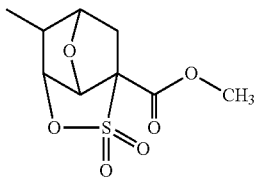 (3-1-29)
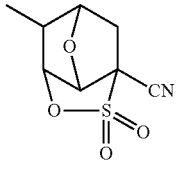 (3-1-30)
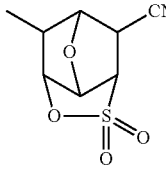 (3-1-31)

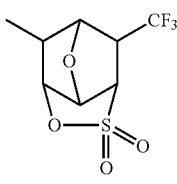
(3-1-32)

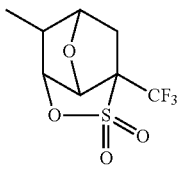
(3-1-33)

[Formula 23]

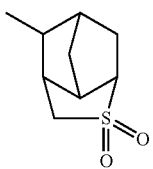
(3-2-1)

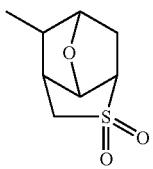
(3-2-2)

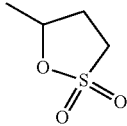
(3-3-1)

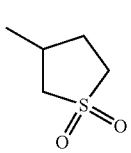
(3-4-1)

As the cyclic group containing —SO$_2$—, among the above, a group represented by the above formula (3-1) is preferable, at least one selected from the groups represented by any one of the above chemical formulae (3-1-1), (3-1-18), (3-3-1), and (3-4-1) is more preferable, and a group represented by the above chemical formula (3-1-1) is the most preferable.

Lactone-containing Cyclic Group

The "lactone-containing cyclic group" denotes a cyclic group containing a ring (lactone ring) containing —O—C(=O)— in its ring skeleton. The lactone ring is counted as a first ring, and when only the lactone ring is present, the group is called a monocyclic group. When a further ring structure is present, the group is called a polycyclic group regardless of its structure. The lactone-containing cyclic group may be a monocyclic group or a polycyclic group.

The lactone cyclic group in the constituent unit (b-3) is not particularly limited, and any lactone cyclic group may be used. Specific examples of the lactone-containing monocyclic group include a group in which one hydrogen atom is removed from 4- to 6-membered lactone, for example, a group in which one hydrogen atom is removed from β-propionolactone, a group in which one hydrogen atom is removed from γ-butyrolactone, and a group in which one hydrogen atom is removed from δ-valerolactone. Furthermore, specific examples of the lactone-containing polycyclic group include groups in which one hydrogen atom is removed from bicycloalkane, tricycloalkane, and tetracycloalkane having a lactone ring.

As the constituent unit (b-3), as long as it has a cyclic group containing —SO$_2$— or a lactone-containing cyclic group, the structure of the other portion is not particularly limited, but preferable constituent unit is at least one constituent unit selected from the group consisting of a constituent unit (b-3-S) derived from acrylic ester in which a hydrogen atom bonded to a carbon atom at α position may be substituted and including cyclic group containing —SO$_2$—, and a constituent unit (b-3-L) derived from acrylic ester in which a hydrogen atom bonded to a carbon atom at α position may be substituted and including a lactone-containing cyclic group.

[Constituent Unit (b-3-S)]

Specific examples of the constituent unit (b-3-S) include a constituent unit represented by the following formula (b-S1).

[Formula 24]

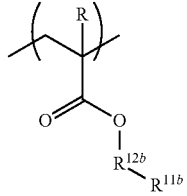
(b-S1)

(In the formula, R is a hydrogen atom, an alkyl group having 1 or more and 5 or less carbon atoms or an alkyl halide group having 1 or more and 5 or less carbon atoms, $R^{11b}$ is a cyclic group containing —SO$_2$—, and $R^{12b}$ is a single bond or a divalent linking group.)

In the formula (b-S1), R is the same as mentioned above. $R^{11b}$ is the same as the cyclic group containing —SO$_2$— mentioned above. $R^{12b}$ may be a single bond or a divalent linking group. A divalent linking group is preferable because it is excellent in the advantageous effect of the present invention.

The divalent linking group in $R^{12b}$ is not particularly limited, but it suitably includes a divalent hydrocarbon group which may have a substituent, a divalent linking group including a hetero atom, and the like.

—Divalent Hydrocarbon Group which may have a Substituent

The hydrocarbon group as a divalent linking group may be an aliphatic hydrocarbon group, or may be an aromatic hydrocarbon group. The aliphatic hydrocarbon group means a hydrocarbon group which does not have aromatic property. The aliphatic hydrocarbon group may be saturated or unsaturated. Usually, a saturated hydrocarbon group is preferable. More specific examples of the aliphatic hydrocarbon group include a linear or branched aliphatic hydrocarbon group, an aliphatic hydrocarbon group including a ring in the structure thereof, and the like.

The number of carbon atoms of the linear or branched aliphatic hydrocarbon group is preferably 1 or more and 10 or less, more preferably 1 or more and 8 or less, and further preferably 1 or more and 5 or less.

A preferable linear aliphatic hydrocarbon group is a linear alkylene group. Specific examples thereof include a methylene group [—$CH_2$—], an ethylene group [—$(CH_2)_2$—], a trimethylene group [—$(CH_2)_3$—], a tetramethylene group [—$(CH_2)_4$—], a pentamethylene group [—$(CH_2)_5$—], and the like.

A preferable branched aliphatic hydrocarbon group is a branched alkylene group. Specific examples thereof include alkyl alkylene group including an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, —$C(CH_2CH_3)_2$—; an alkylethylene group such as —$CH(CH_3)CH_2$—, —$CH(CH_3)CH(CH_3)$—, —$C(CH_3)_2CH_2$—, —$CH(CH_2CH_3)CH_2$—, —$C(CH_2CH_3)_2$—$CH_2$—; an alkyl trimethylene group such as —$CH(CH_3)CH_2CH_2$—, —$CH_2CH(CH_3)CH_2$—; alkyl tetramethylene group such as —$CH(CH_3)CH_2CH_2CH_2$—, —$CH_2CH(CH_3)CH_2CH_2$—, and the like. As the alkyl group in the alkyl alkylene group, a linear alkyl group having 1 or more and 5 or less carbon atoms is preferable.

The linear or branched aliphatic hydrocarbon group may have or not may have a substituent (a group or an atom other than a hydrogen atom) for substituting a hydrogen atom. Examples of the substituent include a fluorinated alkyl group having 1 or more and 5 or less carbon atoms, which may be substituted with a fluorine atom and a fluorine atom, an oxo group (=O), and the like.

Examples of the aliphatic hydrocarbon group including a ring in the structure include a cyclic aliphatic hydrocarbon group (a group in which two hydrogen atoms are removed from an aliphatic hydrocarbon ring), a group in which the cyclic aliphatic hydrocarbon group is bonded to a terminal of the linear or branched aliphatic hydrocarbon group, a group in which the cyclic aliphatic hydrocarbon group is interposed in a middle of the linear or branched aliphatic hydrocarbon group, and the like, which may include a substituent including a hetero atom in the ring structure thereof. Examples of the linear or branched aliphatic hydrocarbon group include the same as mentioned above.

The number of carbon atoms of the cyclic aliphatic hydrocarbon group is preferably 3 or more and 20 or less, and more preferably 3 or more and 12 or less.

The cyclic aliphatic hydrocarbon group may be polycyclic or may be monocyclic. Preferable monocyclic aliphatic hydrocarbon group is a group in which two hydrogen atoms are removed from monocycloalkane. The number of carbon atoms of the monocycloalkane is preferably 3 or more and 6 or less. Specific examples thereof include cyclopentane, cyclohexane, and the like. Preferable polycyclic aliphatic hydrocarbon group is a group in which two hydrogen atoms are removed from polycycloalkane. The number of carbon atoms of the polycycloalkane is preferably 7 or more and 12 or less. Specific examples thereof include adamantane, norbornane, isobornane, tricyclodecane, tetracyclododecane, and the like.

The cyclic aliphatic hydrocarbon group may have or not may have a substituent (a group or an atom other than a hydrogen atom) for substituting a hydrogen atom. Examples of the substituent include an alkyl group, an alkoxy group, a halogen atom, an alkyl halide group, a hydroxyl group, an oxo group (=O), and the like.

The alkyl group as the substituent as mentioned above is preferably an alkyl group having 1 or more and 5 or less carbon atoms, and more preferably a methyl group, an ethyl group, a propyl group, an n-butyl group, and a tert-butyl group.

As the alkoxy group as a substituent as mentioned above, an alkoxy group having 1 or more and 5 or less carbon atom is preferable, a methoxy group, an ethoxy group, an n-propoxy group, an iso-propoxy group, an n-butoxy group, and a tert-butoxy group are more preferable, and a methoxy group, an ethoxy group are particularly preferable.

Examples of a halogen atom as the substituent mentioned above include a fluorine atom, a chlorine atom, a bromine atom, an iodine atom, and the like. A fluorine atom is preferable.

Examples of an alkyl halide group as the substituent mentioned above include a group in which a part or all of the hydrogen atoms of the alkyl group are substituted with the halogen atom.

In the cyclic aliphatic hydrocarbon group, a part of the carbon atoms constituting a ring structure may be substituted with —O—, or —S—. Preferable examples of the substituent including a hetero atom include —O—, —C(=O)—O—, —S—, —S(=O)$_2$—, and —S(=O)$_2$—O—.

An aromatic hydrocarbon group as the divalent hydrocarbon group is a divalent hydrocarbon group having at least one aromatic ring and which may have a substituent. The aromatic ring is not particularly limited as long as it is a cyclic conjugated system having 4n+2 π electrons, and it may be monocyclic or may be polycyclic. The number of carbon atoms of the aromatic ring is preferably 5 or more and 30 or less, more preferably 5 or more and 20 or less, further preferably 6 or more and 15 or less, and particularly preferably 6 to 12. However, the number of carbon atoms of the substituent is not included in the number of carbon atoms.

Specific examples of the aromatic ring include aromatic hydrocarbon ring such as benzene, naphthalene, anthracene, and phenanthrene; aromatic heterocycle in which a part of carbon atoms constituting the aromatic hydrocarbon ring is substituted with a hetero atom; and the like. Examples of the hetero atom in the aromatic heterocycle include an oxygen atom, a sulfur atom, and a nitrogen atom, and the like. Specific examples of the aromatic heterocycle include a pyridine ring, a thiophene ring, and the like.

Specific examples of the aromatic hydrocarbon group as a divalent hydrocarbon group include a group in which two hydrogen atoms are removed from the aromatic hydrocarbon ring or the aromatic heterocycle (an arylene group, or a heteroarylene group); a group in which two hydrogen atoms are removed from an aromatic compound including two or more aromatic rings (for example, biphenyl, fluorene, and the like); a group in which one hydrogen atom of the aromatic hydrocarbon ring or the aromatic heterocycle (an aryl group, or a heteroaryl group) is substituted with an aryl group of an arylalkyl group such as an alkylene group (for example, a group in which one more hydrogen atom is removed from a benzyl group, a phenethyl group, a 1-naphthylmethyl group, a 2-naphthylmethyl group, 1-naphthylethyl group, and a 2-naphthylethyl group), and the like.

The number of carbon atoms of the aryl group or the alkylene group bonded to a heteroaryl group is preferably 1 or more and 4 or less, more preferably 1 or 2, and particularly preferably 1.

In the aromatic hydrocarbon group, a hydrogen atom possessed by the aromatic hydrocarbon group may be substituted. For example, a hydrogen atom bonded to an aromatic ring in the aromatic hydrocarbon group may be substituted. Examples of the substituent include an alkyl group, an alkoxy group, a halogen atom, an alkyl halide group, a hydroxyl group, an oxo group (=O), and the like.

A more preferable alkyl group as the substituent is an alkyl group having 1 or more and 5 or less carbon atoms. A methyl group, an ethyl group, an n-propyl group, an n-butyl group, and a tert-butyl group are more preferable.

As the alkoxy group as a substituent as mentioned above, an alkoxy group having 1 or more and 5 or less carbon atoms is preferable, a methoxy group, an ethoxy group, an n-propoxy group, an iso-propoxy group, an n-butoxy group, and a tert-butoxy group are more preferable, and a methoxy group, an ethoxy group are more preferable.

Examples of a halogen atom as the substituent mentioned above include a fluorine atom, a chlorine atom, a bromine atom, an iodine atom, and the like. A fluorine atom is preferable.

Examples of an alkyl halide group as the substituent mentioned above include a group in which a part or all of the hydrogen atoms of the alkyl group are substituted with the halogen atom.

—Divalent Linking Group Including Hetero Atom

The hetero atom in the divalent linking group including a hetero atom is atoms other than a carbon atom and a hydrogen atom, and examples thereof include an oxygen atom, a nitrogen atom, a sulfur atom, a halogen atom, and the like.

Specific examples of the divalent linking group including a hetero atom include nonhydrocarbon linking groups such as —O—, —C(=O)—, —C(=O)—O—, —O—C(=O)—O—, —S—, —S(=O)$_2$—, —S(=O)$_2$—O—, —NH—, —NH—C(=O)—, —NH—C(=NH)—, and =N—, and a combination of at least one of these nonhydrocarbon linking groups and a divalent hydrocarbon group, and the like. Examples of the divalent hydrocarbon group include the same groups as the above-mentioned divalent hydrocarbon group which may have a substituent, and a linear or branched aliphatic hydrocarbon group is preferable.

Among the above-mention, —NH— in —C(=O)—NH—, —NH—, H in —NH—C(=NH)— may be substituted with substituents such as an alkyl group, an acyl group, respectively. The number of carbon atoms of the substituent is preferably 1 or more and 10 or less, more preferably 1 or more and 8 or less, and particularly preferably 1 or more and 5 or less.

As the divalent linking group in $R^{12b}$, a linear or branched alkylene group, a cyclic aliphatic hydrocarbon group, or a divalent linking group including a hetero atom are particularly preferable.

When divalent linking group in $R^{12b}$ is a linear or branched alkylene group, the number of carbon atoms of the alkylene group is preferably 1 or more and 10 or less, more preferably 1 or more and 6 or less, particularly preferably 1 or more and 4 or less, and the most preferably 1 or more and 3 or less. Specific examples thereof include the same group as the linear alkylene group and branched alkylene group described as the linear or branched aliphatic hydrocarbon group in the description of "a divalent hydrocarbon group which may have a substituent" as the above-mentioned divalent linking group.

When divalent linking group in $R^{12b}$ is a cyclic aliphatic hydrocarbon group, examples of the cyclic aliphatic hydrocarbon group include a group that is the same as the cyclic aliphatic hydrocarbon group described as an "aliphatic hydrocarbon group including a ring in the structure" in the description of the "divalent hydrocarbon group which may have a substituent" as the above-mentioned divalent linking group.

As the cyclic aliphatic hydrocarbon group, a group in which two or more hydrogen atoms are removed from cyclopentane, cyclohexane, norbornane, isobornane, adamantane, tricyclodecane, or tetracyclododecane is particularly preferable.

When the divalent linking group in $R^{12b}$ is a divalent linking group including a hetero atom, preferable examples of the linking group include —O—, —C(=O)—O—, —C(=O)—, —O—C(=O)—O—, —C(=O)—NH—, —NH— (H may be substituted with a substituent such as an alkyl group and an acyl group), —S—, —S(=O)$_2$—, —S(=O)$_2$—O—, a group represented by the general formula: —Y$^1$—O—Y$^2$—, —[Y$^1$—C(=O)—O]$_{m'}$—Y$^2$—, or —Y$^1$—O—C(=O)—Y$_2$— [in the formula, Y$^1$ and Y$^2$ each independently represent a divalent hydrocarbon group which may have a substituent, 0 is an oxygen atom, and m' is an integer of 0 or more and 3 or less], and the like.

When the divalent linking group in $R^{12b}$ is —NH—, a hydrogen atom in —NH— may be substituted with substituents such as an alkyl group, and acyl. The number of carbon atoms of the substituent (an alkyl group, an acyl group, and the like) is preferably 1 or more and 10 or less, more preferably 1 or more and 8 or less, and particularly preferably 1 or more and 5 or less.

In the formula: —Y$^1$—O—Y$^2$—, —[Y$^1$—C(=O)—O]$_{m'}$—Y$^2$—, or —Y$^1$—O—C(=O)—Y$^2$—, Y$^1$ and Y$^2$ each independently represent a divalent hydrocarbon group which may have a substituent. Examples of the divalent hydrocarbon group include the same groups as the "divalent hydrocarbon group which may have a substituent" described as the divalent linking group.

As Y$^1$, a linear aliphatic hydrocarbon group is preferable, a linear alkylene group is more preferable, a linear alkylene group having 1 or more and 5 or less carbon atoms is more preferable, and a methylene group and an ethylene group are particularly preferable.

As Y$^2$, a linear or branched aliphatic hydrocarbon group is preferable, and a methylene group, an ethylene group and an alkylmethylene group are more preferable. As an alkyl group in the alkylmethylene group, a linear alkyl group having 1 or more and 5 or less carbon atoms is preferable, a linear alkyl group having 1 or more and 3 or less carbon atoms is more preferable, and a methyl group is particularly preferable.

In a group represented by the formula: —[Y$^1$—C(=O)—O]$_{m'}$—Y$^2$—, m' is an integer of 0 or more and 3 or less, preferably an integer of 0 or more and 2 or less, and more preferably 0 or 1, and particularly preferably 1. In other words, as the group represented by the formula: —[Y$^1$—C(=O)—O]$_{m'}$—Y$^2$—, a group represented by the formula: —Y$^1$—C(=O)—O—Y$^2$— is particularly preferable. Among them, a group represented by the formula: —(CH$_2$)$_{a'}$—C(=O)—O—(CH$_2$)$_{b'}$— is preferable. In the formula, a' is an integer of 1 or more and 10 or less, preferably an integer of 1 or more and 8 or less, more preferably an integer of 1 or more and 5 or less, further preferably an integer of 1 or 2, and most preferably 1. b' is an integer of 1 to 10, preferably an integer of 1 to 8, more preferably an integer of 1 to 5, further preferably an integer of 1 or 2, and most preferably 1.

In the divalent linking group in $R^{12b}$, as the divalent linking group including a hetero atom, an organic group including a combination of at least one nonhydrocarbon group and a divalent hydrocarbon group is preferable. Among them, a linear group having an oxygen atom as a hetero atom, for example, a group including an ether bond, or an ester bond is preferable, and a group represented by the above formula: —Y$^1$—O—Y$^2$— or —[Y$^1$—C(=O)—O]$_{m'}$—Y$^2$— or —Y$^1$—O—C(=O)—Y$^2$— is more preferable, and a group represented by the above formula: —[Y$^1$—C(=O)—O]$_{m'}$—Y$^2$—, or —Y$^1$—O—C(=O)—Y$^2$— is particularly preferable.

As the divalent linking group in R$^{12b}$, a group including an alkylene group or an ester bond (—C(=O)—O—) is preferable.

The alkylene group is preferably a linear or branched alkylene group. Suitable examples of the linear aliphatic hydrocarbon group include a methylene group [—CH$_2$—], an ethylene group [—(CH$_2$)$_2$—], a trimethylene group [—(CH$_2$)$_3$—], a tetramethylene group [—(CH$_2$)$_4$—], a pentamethylene group [—(CH$_2$)$_5$—], and the like. Suitable examples of the branched alkylene group include alkyl alkylene group including an alkyl methylene group such as —CH(CH$_3$)—, —CH(CH$_2$CH$_3$)—, —C(CH$_3$)$_2$—, —C(CH$_3$) (CH$_2$CH$_3$)—, —C(CH$_3$) (CH$_2$CH$_2$CH$_3$)—, —C(CH$_2$CH$_3$)$_2$—; an alkyl ethylene group such as —CH(CH$_3$)CH$_2$—, —CH(CH$_3$)CH(CH$_3$)—, —C(CH$_3$)$_2$CH$_2$—, —CH(CH$_2$CH$_3$) CH$_2$—, —C(CH$_2$CH$_3$)$_2$—CH$_2$—; an alkyl trimethylene group such as —CH(CH$_3$)CH$_2$CH$_2$—, —CH$_2$CH(CH$_3$)CH$_2$—; alkyl tetramethylene group such as —CH(CH$_3$)CH$_2$CH$_2$CH$_2$—, —CH$_2$CH(CH$_3$)CH$_2$CH$_2$—, and the like.

As the divalent linking group including an ester bond, a group represented by the formula: —R$^{13b}$—C(=O)—O— [in the formula, R$^{13b}$ is a divalent linking group] is preferable. In other words, a constituent unit (b-3-S) is preferably a constituent unit represented by the following formula (b-S1-1).

[Formula 25]

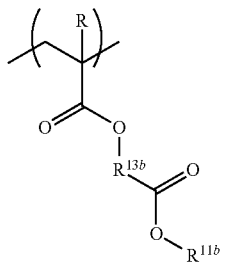

(b-S1-1)

(In the formula, R, and R$^{11b}$ are respectively the same as those mentioned above, R$^{13b}$ is a divalent linking group.)

R$^{13b}$ is not particularly limited, and, for example, includes the same as the divalent linking group in R$^{12b}$ mentioned above. As the divalent linking group in R$^{13b}$, a linear or branched alkylene group, an aliphatic hydrocarbon group including a ring in a structure, or a divalent linking group including a hetero atom is preferable, and a linear or branched alkylene group, or a divalent linking group including an oxygen atom as a hetero atom is preferable.

As the linear alkylene group, a methylene group, or an ethylene group is preferable, and a methylene group is particularly preferable. As the branched alkylene group, an alkylmethylene group, or an alkylethylene group is preferable, and —CH(CH$_3$)—, —C(CH$_3$)$_2$—, or —C(CH$_3$)$_2$CH$_2$— is particularly preferable.

As the divalent linking group including an oxygen atom, a divalent linking group including an ether bond or an ester bond is preferable, and the above-mentioned —Y$^1$—O—Y$^2$—, —[Y$^1$—C(=O)—O]$_{m'}$—Y$^2$—, or —Y$^1$—O—C(=O)—Y$^2$— is more preferable. Y$^1$, and Y$^2$ each independently represent a divalent hydrocarbon group which may have a substituent, and m' is an integer of 0 or more and 3 or less. Among them, —Y$^1$—O—C(=O)—Y$^2$— is preferable, and a group represented by —(CH$_2$)$_c$—O—C(=O)—(CH$_2$)$_d$— is particularly preferable. c is an integer of 1 or more and 5 or less, and preferably 1 or 2. d is an integer of 1 or more and 5 or less, and preferably 1 or 2.

As the constituent unit (b-3-S), a constituent unit represented by the following formula (b-S1-11) or (b-S1-12) is particularly preferable, and the constituent unit represented by the formula (b-S1-12) is more preferable.

[Formula 26]

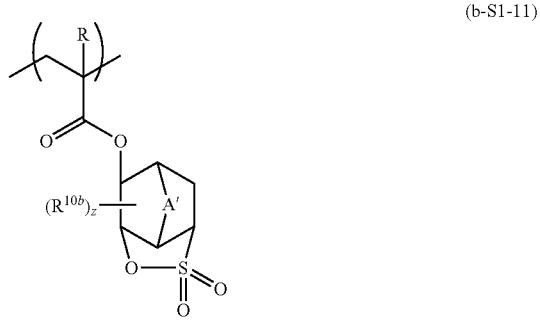

(b-S1-11)

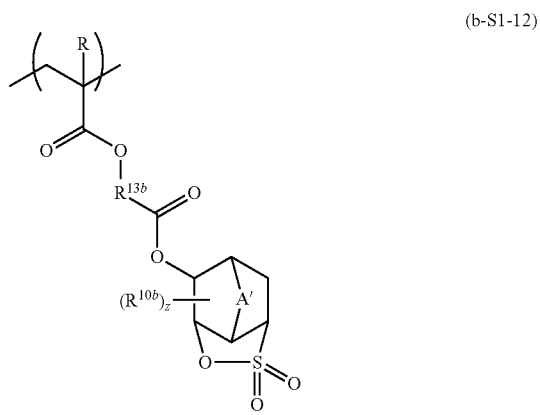

(b-S1-12)

(In the formula, R, A', R$^{10b}$, z, and R$^{13b}$ are respectively the same as those mentioned above.)

In the formula (b-S1-11), A' is preferably a methylene group, an oxygen atom (—O—), or a sulfur atom (—S—).

As R$^{13b}$, a linear or branched alkylene group or a divalent linking group including an oxygen atom is preferable. Examples of the linear or branched alkylene group in R$^{13b}$ respectively include those the same as the linear or branched alkylene group and divalent linking group including an oxygen atom.

As a constituent unit represented by the following formula (b-S1-12), a constituent unit represented by the following formula (b-S1-12a) or (b-S1-12b) is particularly preferable.

[Formula 27]

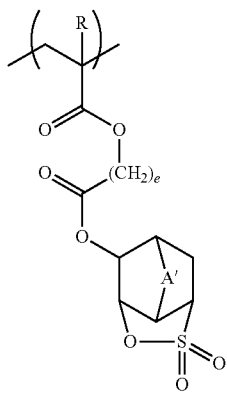
(b-S1-12a)

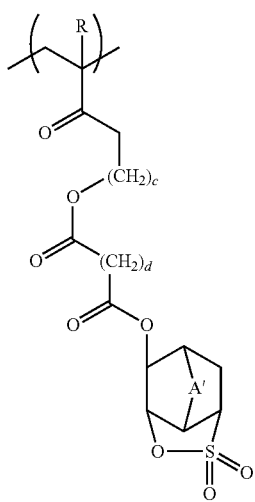
(b-S1-12b)

(In the formula, R and A' are respectively the same as those mentioned above, and c to e are each independently an integer of 1 or more and 3 or less.)

[Constituent Unit (b-3-L)]

Examples of the constituent unit (b-3-L) include a constituent unit in which $R^{11b}$ in the above formula (b-S1) is substituted with a lactone-containing cyclic group, and more specifically include constituent units represented by the following formulae (b-L1) to (b-L5).

[Formula 28]

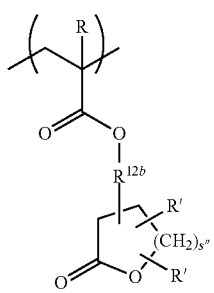
(b-L1)

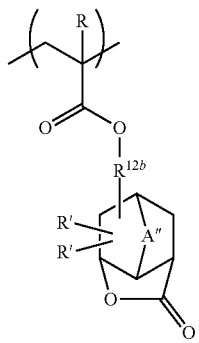
(b-L2)

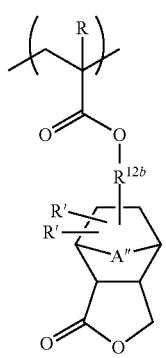
(b-L3)

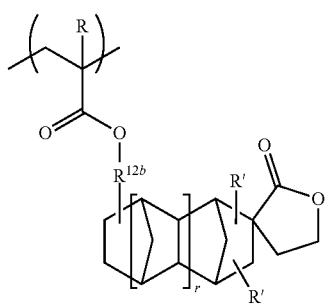
(b-L4)

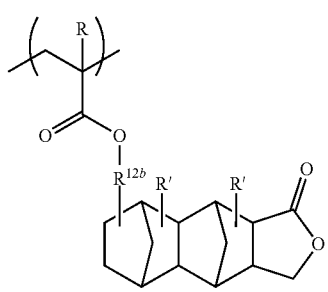
(b-L5)

(In the formula, R represents a hydrogen atom, an alkyl group having 1 or more and 5 or less carbon atoms, or an alkyl halide group having 1 or more and 5 or less carbon atoms; R' each independently represents a hydrogen atom, an alkyl group, an alkoxy group, an alkyl halide group, a hydroxyl group, —COOR", —OC(=O)R", a hydroxy alkyl group, or a cyano group, R" represents a hydrogen atom or an alkyl group; $R^{12b}$ represents a single bond, or a divalent linking group, s" is an integer of 0 or more and 2 or less; A" represents an alkylene group having 1 or more and 5 or less carbon atoms which may include an oxygen atom or a sulfur atom, an oxygen atom, a sulfur atom; r is 0 or 1.)

R in the formulae (b-L1) to (b-L5) are the same as those as mentioned above. Examples of an alkyl group, an alkoxy group, an alkyl halide group, —COOR″, —OC(=O)R″, and a hydroxy alkyl group in R′ are the same as the alkyl group, alkoxy group, alkyl halide group, —COOR″, —OC(=O)R″, and hydroxy alkyl group described as the substituents which the cyclic group containing —SO$_2$— may have.

R′ is preferably a hydrogen atom from the viewpoint of easy industrial availability. The alkyl group in R″ may be any of linear, branched, and cyclic. When R″ is a linear or branched alkyl group, the number of carbon atoms is preferably 1 or more and 10 or less, and more preferably 1 or more and 5 or less. When R″ is a cyclic alkyl group, the number of carbon atoms is preferably 3 or more and 15 or less, more preferably 4 or more and 12 or less, and most preferably 5 or more and 10 or less. Specific examples thereof include a group in which one or more hydrogen atoms are removed from monocycloalkane, and polycycloalkanes such as bicycloalkane, tricycloalkane, and tetracycloalkane, which may be substituted or not substituted with a fluorine atom or a fluorinated alkyl group. Specific examples thereof include a group in which one or more hydrogen atoms are removed from monocycloalkane such as cyclopentane and cyclohexane, and polycycloalkane such as adamantane, norbornane, isobornane, tricyclodecane, and tetracyclododecane, and the like. Examples of A″ include those the same as A′ in the above formula (3-1). A″ is preferably an alkylene group having 1 or more and 5 or less carbon atoms, an oxygen atom (—O—) or a sulfur atom (—S—), and more preferably an alkylene group having 1 or more and 5 or less carbon atoms or —O—. As the alkylene group having 1 or more and 5 or less carbon atoms, a methylene group or a dimethyl methylene group are more preferable, and a methylene group is the most preferable.

$R^{12b}$ is the same as $R^{12b}$ in the above formula (b-S1). In the formula (b-L1), s″ is preferably 1 or 2. Hereinafter, specific examples of the constituent units represented by the formulae (b-L1) to (b-L3) are shown. In each of the following formulae, $R^{\alpha}$ represents a hydrogen atom, a methyl group, or a trifluoromethyl group.

[Formula 29]

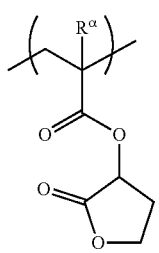
(b-L1-1)

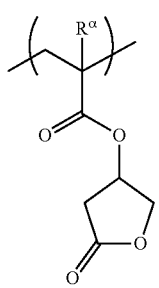
(b-L1-2)

-continued

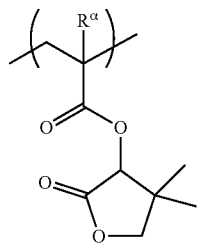
(b-L1-3)

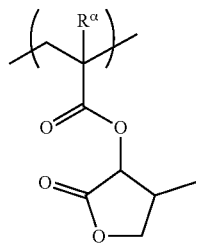
(b-L1-4)

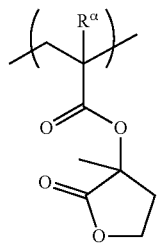
(b-L1-5)

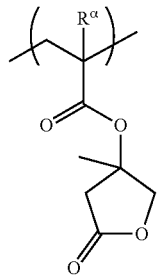
(b-L1-6)

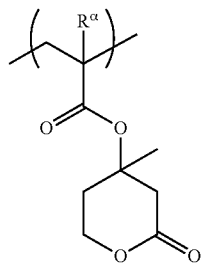
(b-L1-7)

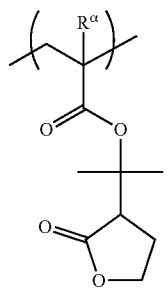
(b-L1-8)

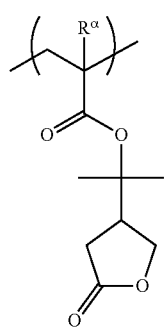
(b-L1-9)
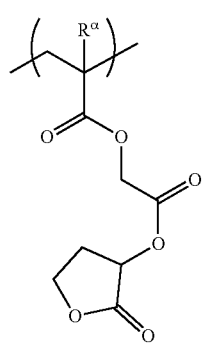
(b-L1-10)
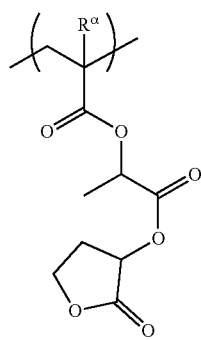
(b-L1-11)
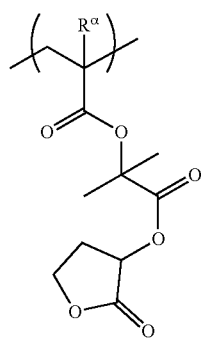
(b-L1-12)
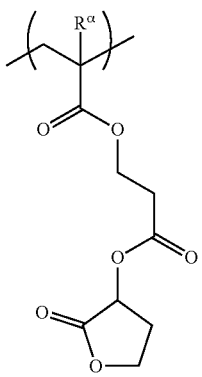
(b-L1-13)
[Formula 30]
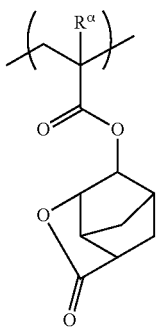
(b-L2-1)
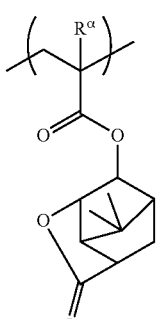
(b-L2-2)
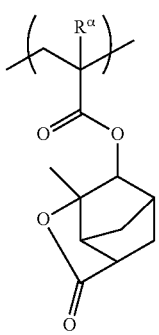
(b-L2-3)

(b-L2-4)
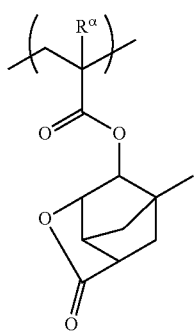
(b-L2-5)
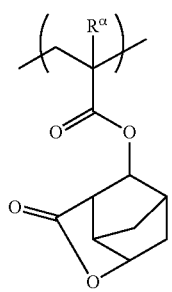
(b-L2-6)
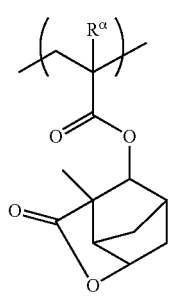
(b-L2-7)
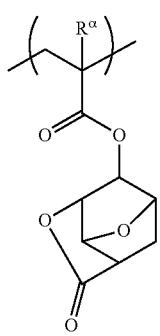
(b-L2-8)
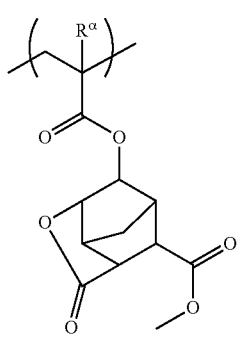
(b-L2-9)
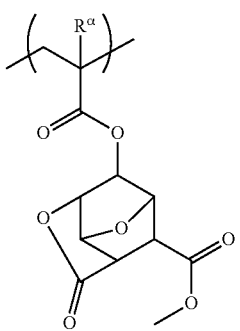
(b-L2-10)
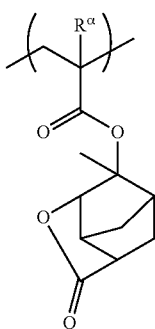
(b-L2-11)
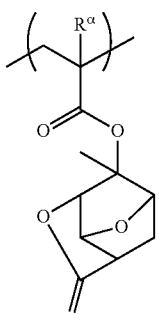
(b-L2-12)
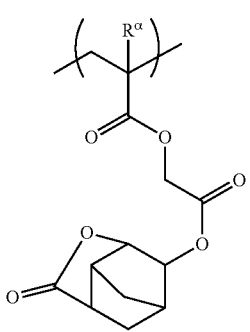

(b-L2-13)
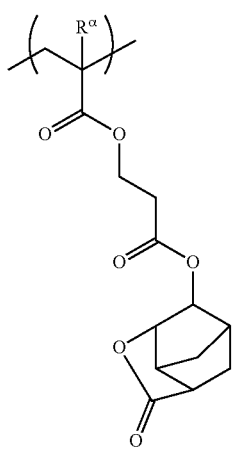
(b-L2-14)
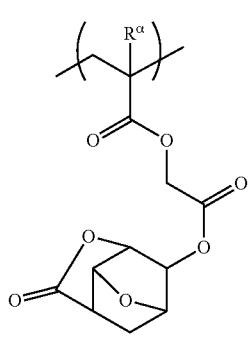
(b-L2-15)
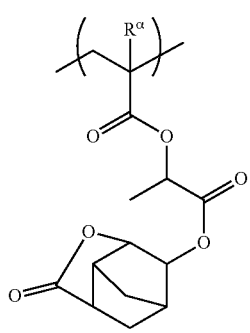
(b-L2-16)
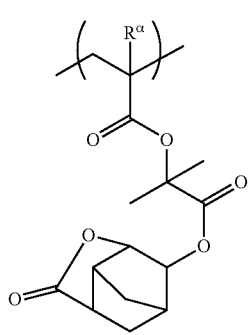
(b-L2-17)
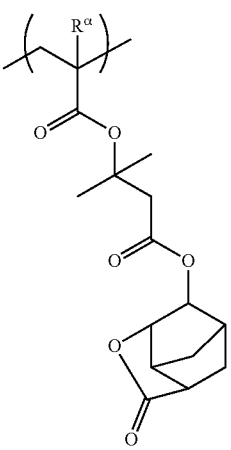
[Formula 31]
(b-L3-1)
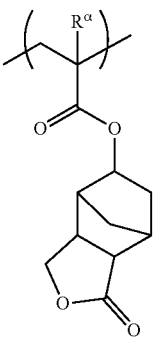
(b-L3-2)
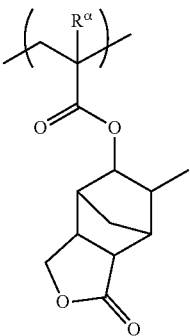
(b-L3-3)
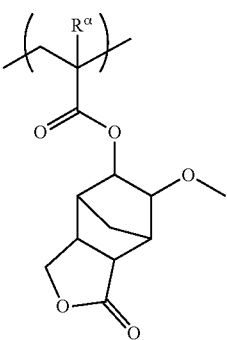

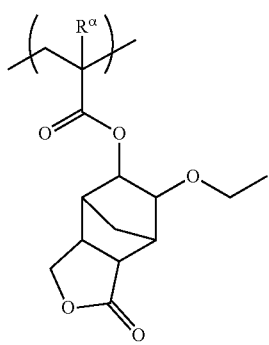
(b-L3-4)

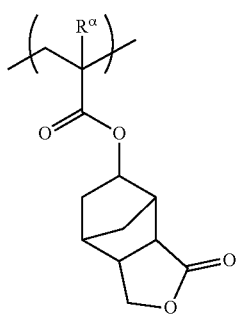
(b-L3-5)

As the constituent unit (b-3-L), at least one selected from the group consisting of the constituent units represented by the above formulae (b-L1) to (b-L5) is preferable, at least one selected from the group consisting of the constituent units represented by the formulae (b-L1) to (b-L3) is more preferable, and at least one selected from the group consisting of the constituent units represented by the formula the above formula (b-L1) or (b-L3) is particularly preferable. Among them, at least one selected from the group consisting of the constituent units represented by the above formulae (b-L1-1), (b-L1-2), (b-L2-1), (b-L2-7), (b-L2-12), (b-L2-14), (b-L3-1), and (b-L3-5) is preferable.

Furthermore, as the constituent unit (b-3-L), constituent units represented by the following formulae (b-L6) to (b-L7) are also preferable.

[Formula 32]

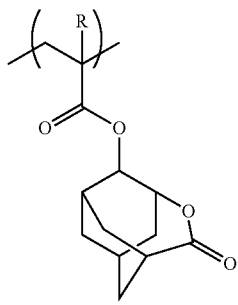
(b-L6)

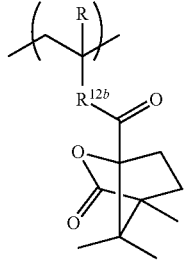
(b-L7)

In the formulae (b-L6) and (b-L7), R and $R^{12b}$ are the same as those as mentioned above.

Furthermore, the acrylic resin (B3) includes constituent units represented by the following formulae (b5) to (b7) including an acid dissociable group as a constituent unit for enhancing solubility in alkali of acrylic resin (B3) under the action of acid.

[Formula 33]

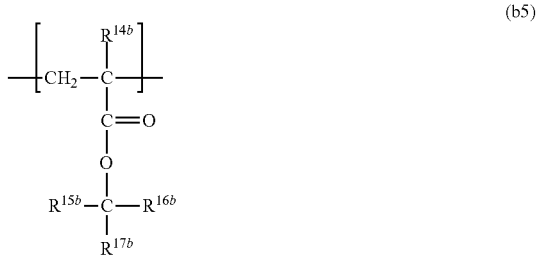
(b5)

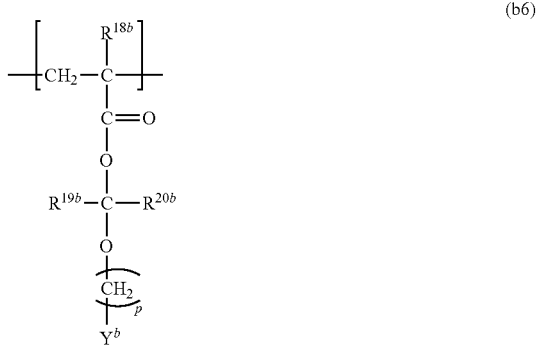
(b6)

-continued

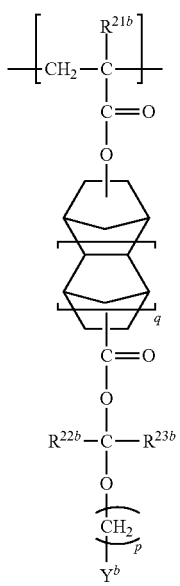
(b7)

$R^{14b}$, and $R^{18b}$ to $R^{23b}$ in the above formulae (b5) to (b7) each independently represent a hydrogen atom, a linear or branched alkyl group having 1 or more and 6 or less carbon atoms, a fluorine atom or a linear or branched fluorinated alkyl group having 1 or more and 6 or less carbon atoms. $R^{15b}$ to $R^{17b}$ each independently represent a linear or branched alkyl group having 1 or more and 6 or less carbon atoms, a linear or branched fluorinated alkyl group having 1 or more and 6 or less carbon atoms, or an aliphatic cyclic group having 5 or more and 20 or less carbon atoms, and each independently represent a linear or branched alkyl group having 1 or more and 6 or less carbon atoms or a linear or branched fluorinated alkyl group having 1 or more and 6 or less carbon atoms. $R^{16b}$ and $R^{17b}$ may be bonded to each other to form a hydrocarbon ring having 5 or more and 20 or less carbon atoms together with a carbon atom to which the both are attached. $Y^b$ represents an aliphatic cyclic group or an alkyl group which may have a substituent. p is an integer of 0 or more and 4 or less, and q is 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. The fluorinated alkyl group refers to the alkyl groups of which a part or all of the hydrogen atoms are substituted with fluorine atom(s). Specific examples of the aliphatic cyclic group include a group in which one or more hydrogen atoms are removed from monocycloalkane, and polycycloalkanes such as bicycloalkane, tricycloalkane, and tetracycloalkane. Specific examples thereof include a group in which one hydrogen atom is removed from monocycloalkanes such as cyclopentane, cyclohexane, cycloheptane, and cyclooctane, and polycycloalkanes such as adamantane, norbornane, isobornane, tricyclodecane, and tetracyclododecane. In particular, a group in which one hydrogen atom is removed from cyclohexane and adamantane (which further may have a substituent) is preferable.

In a case where the above $R^{16b}$ and $R^{17b}$ do not bonded to each other to form a hydrocarbon ring, the above $R^{15b}$, $R^{16b}$ and $R^{17b}$ are preferably a linear or branched alkyl group having 2 or more and 4 or less carbon atoms in view of high contrast, good resolution, good focal depth-width and the like. The above $R^{19b}$, $R^{20b}$, $R^{22b}$, and $R^{23b}$ are preferably a hydrogen atom or a methyl group.

The above $R^{16b}$ and $R^{17b}$ may form an aliphatic cyclic group having 5 or more and 20 or less carbon atoms together with a carbon atom to which the both are bonded. Specific examples of such an aliphatic cyclic group include a group in which one or more hydrogen atoms are removed from monocycloalkane; and polycycloalkane such as bicycloalkane, tricycloalkane and tetracycloalkane. Specific examples thereof include a group in which one or more hydrogen atoms are removed from monocycloalkane such as cyclopentane, cyclohexane, cycloheptane and cyclooctane; and polycycloalkane such as adamantane, norbornane, isobornane, tricyclodecane and tetracyclododecane; and the like. In particular, preferred is a group (which further may have a substituent) in which one or more hydrogen atoms are removed from cyclohexane and adamantane.

Further, in a case where an aliphatic cyclic group to be formed with the above $R^{16b}$ and $R^{17b}$ has a substituent on the ring skeleton thereof, examples of the above substituent include a polar group such as a hydroxy group, a carboxyl group, a cyano group and an oxygen atom (=O), and a linear or branched alkyl group having 1 or more and 4 or less carbon atoms. As the polar group, an oxygen atom (=O) is particularly preferred.

The aforementioned $Y^b$ is an aliphatic cyclic group or an alkyl group; and examples thereof are monocycloalkanes and polycycloalkanes such as bicycloalkanes, tricycloalkanes and tetracycloalkanes from which at least one hydrogen atom is removed. Specific examples thereof are monocycloalkanes such as cyclopentane, cyclohexane, cycloheptane and cyclooctane, and polycycloalkanes such as adamantane, norbornane, isobornane, tricyclodecane and tetracyclododecane, from which at least one hydrogen atom is removed. Particularly preferable is adamantane from which at least one hydrogen atom is removed (which further may have a substituent).

When the alicyclic group of the abovementioned $Y^b$ has a substituent on the ring skeleton, the substituent is exemplified by polar groups such as a hydroxide group, carboxy group, cyano group and oxygen atom (=O), and linear or branched alkyl groups having 1 or more and 4 or less carbon atoms. In particular, the polar group is preferably an oxygen atom (=O).

When $Y^b$ is an alkyl group, it is preferably a linear or branched alkyl group having 1 or more and 20 or less carbon atoms, and more preferably 6 or more and 15 or less carbon atoms. Preferably, the alkyl group is an alkoxyalkyl group in particular; and examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above formula (b5) are those represented by the following formulae (b5-1) to (b5-33).

[Formula 34]
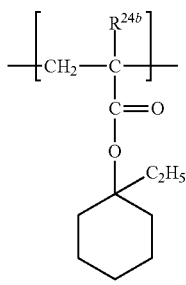
(b5-1)
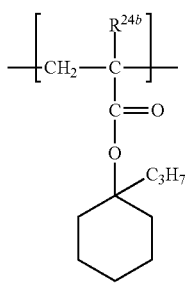
(b5-2)
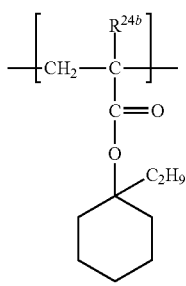
(b5-3)
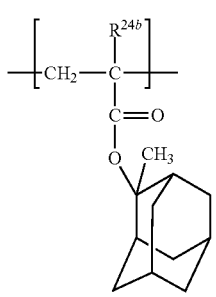
(b5-4)
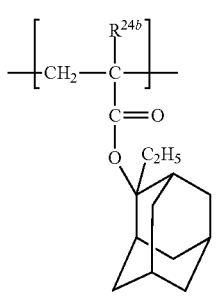
(b5-5)
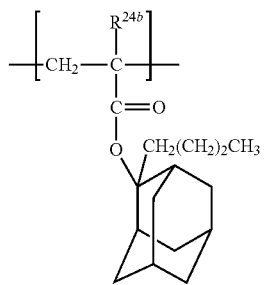
(b5-6)
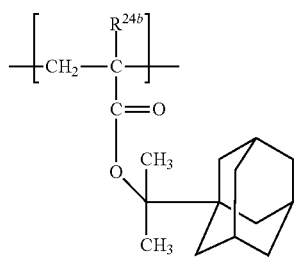
(b5-7)
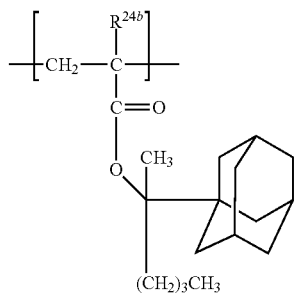
(b5-8)
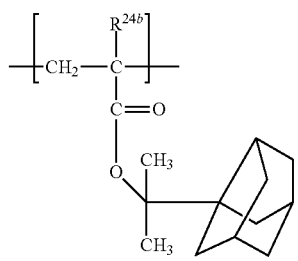
(b5-9)
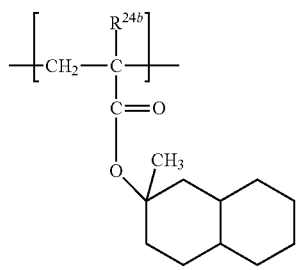
(b5-10)
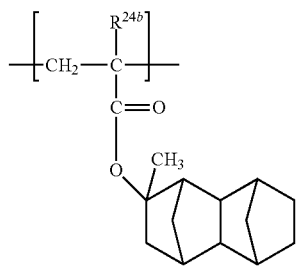
(b5-11)

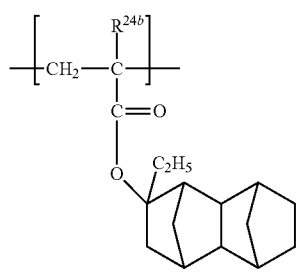
(b5-12)
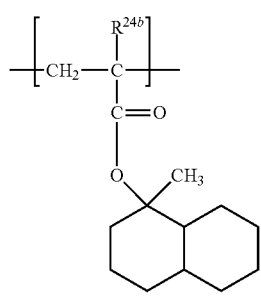
(b5-13)
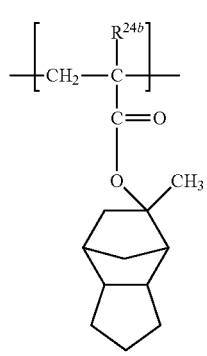
(b5-14)
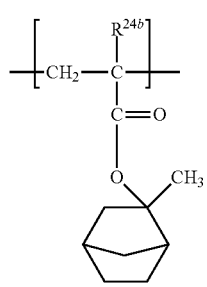
(b5-15)
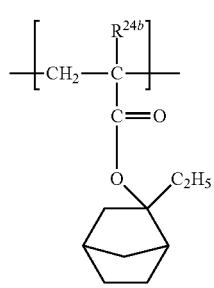
(b5-16)
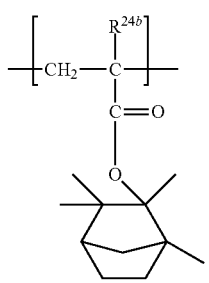
(b5-17)
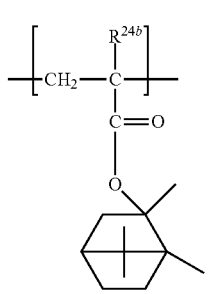
(b5-18)
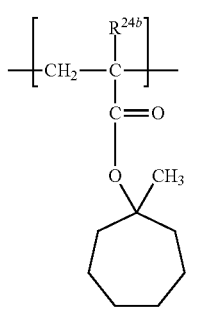
(b5-19)
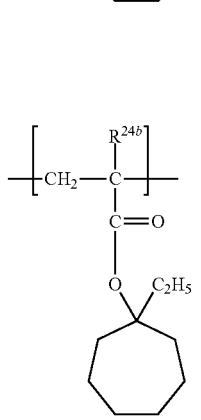
(b5-20)
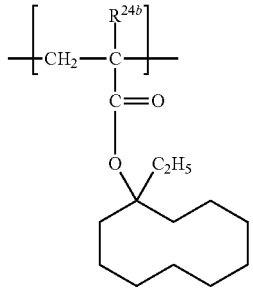
(b5-21)

(b5-22) 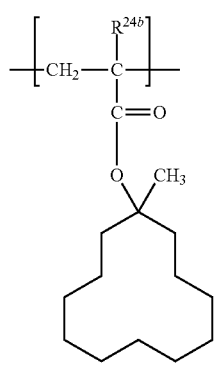
(b5-23) 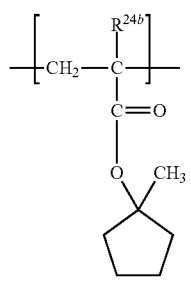
(b5-24) 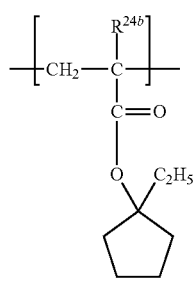
(b5-25) 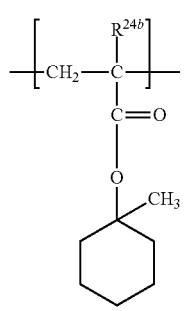
(b5-26) 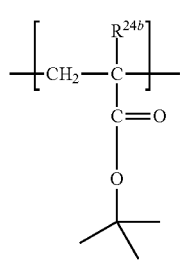
(b5-27) 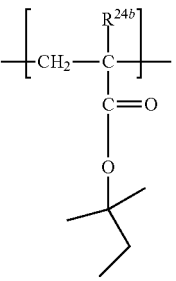
(b5-28) 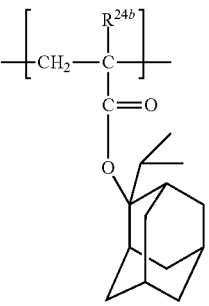
(b5-29) 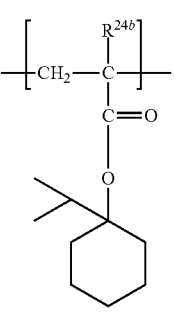
(b5-30) 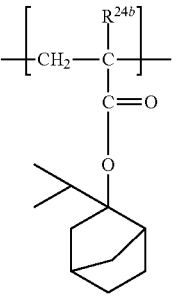
(b5-31) 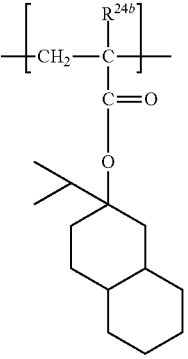

(b5-32) 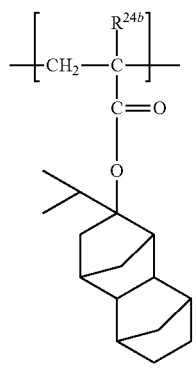
(b5-33) 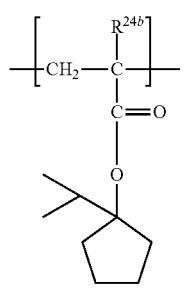
In the above formulae (b5-1) to (b5-33), $R^{24b}$ represents a hydrogen atom or a methyl group.
Preferable specific examples of the structural unit represented by the above formula (b6) include those represented by the following formulae (b6-1) to (b6-26).
[Formula 35]
(b6-1) 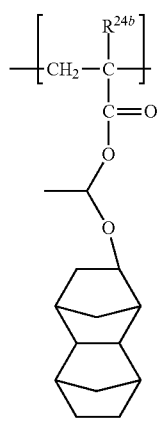
(b6-2) 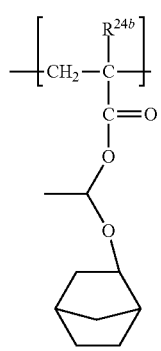
(b6-3) 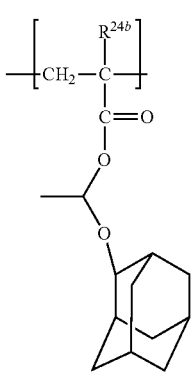
(b6-4) 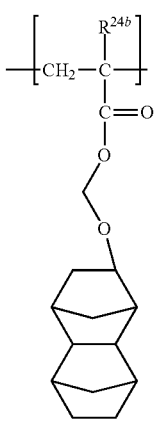
(b6-5) 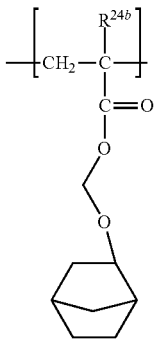
(b6-6) 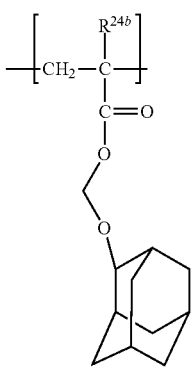

(b6-7)
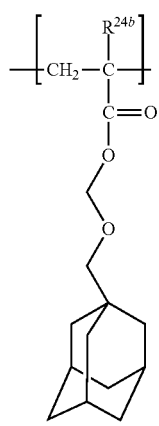
(b6-8)
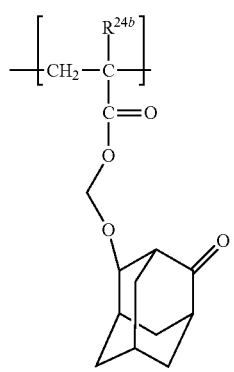
(b6-9)
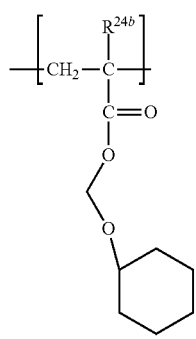
(b6-10)
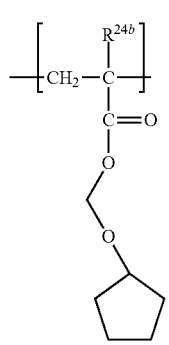
(b6-11)
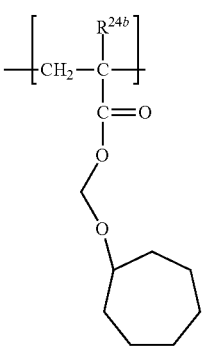
(b6-12)
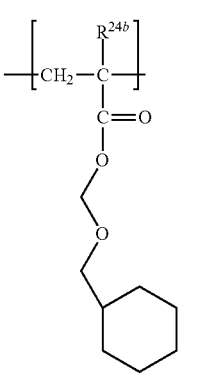
(b6-13)
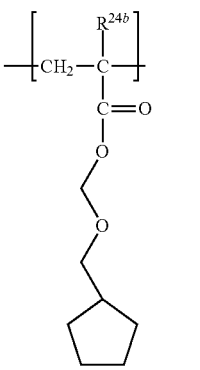
(b6-14)
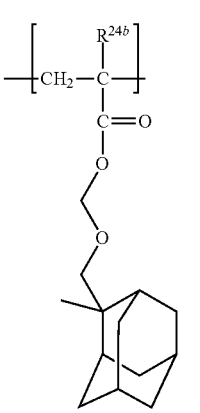

(b6-15) 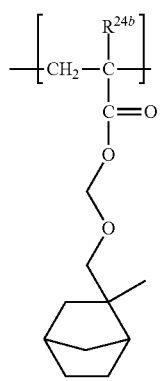
(b6-16) 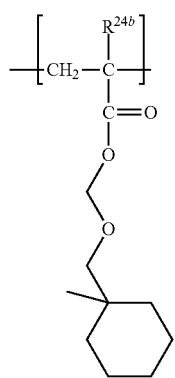
(b6-17) 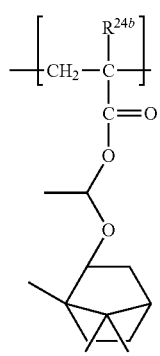
(b6-18) 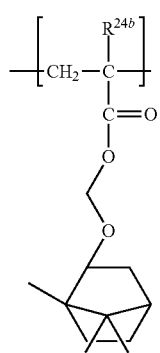
(b6-19) 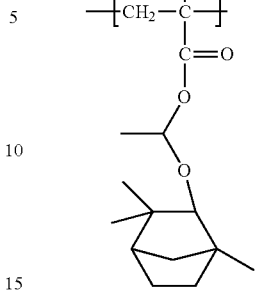
(b6-20) 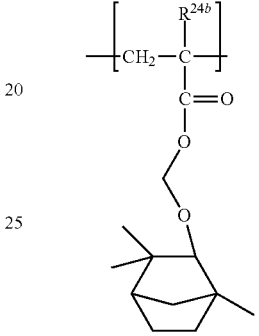
(b6-21) 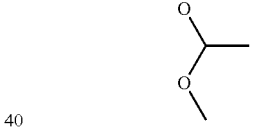
(b6-22) 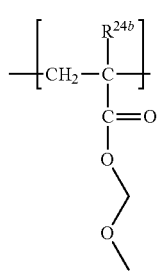
(b6-23) 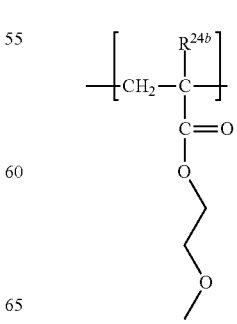

(b6-24)
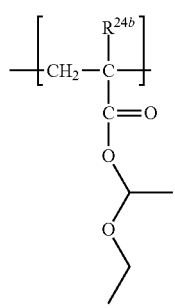
(b6-25)
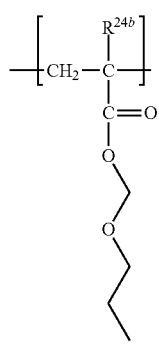
(b6-26)
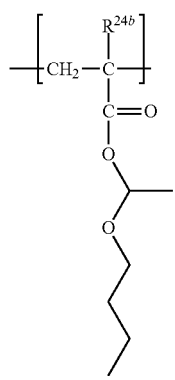
In the above formulae (b6-1) to (b6-26), $R^{24b}$ represents a hydrogen atom or a methyl group.
Preferable specific examples of the structural unit represented by the above formula (b7) include those represented by the following formulae (b7-1) to (b7-15).
[Formula 36]
(b7-1)
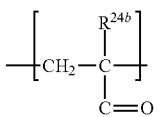
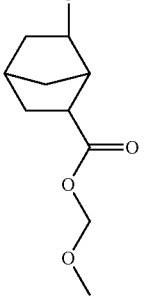
(b7-2)
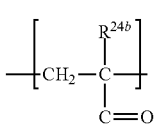
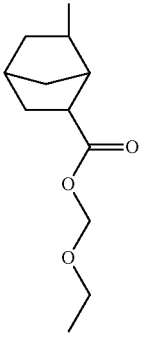
(b7-3)
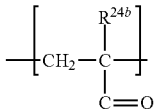
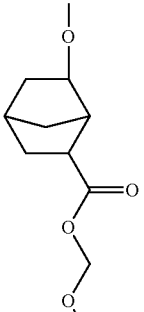
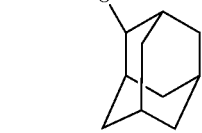

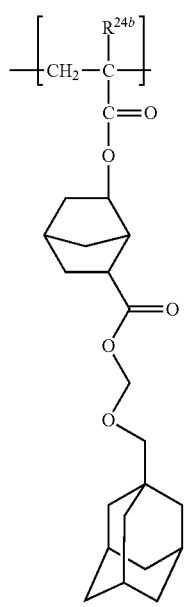 (b7-4)
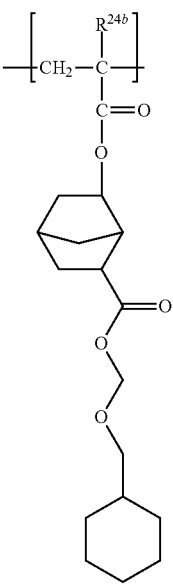 (b7-6)
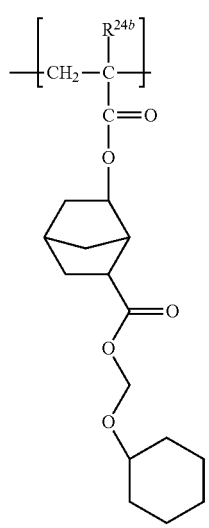 (b7-5)
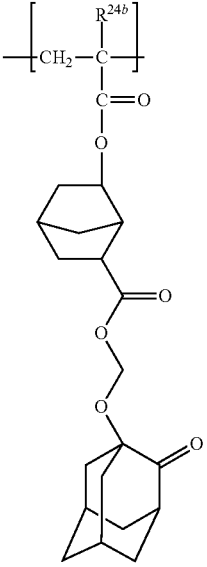 (b7-7)

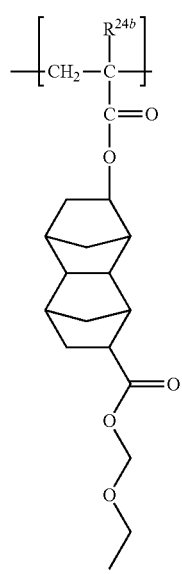
(b7-8)
(b7-9)
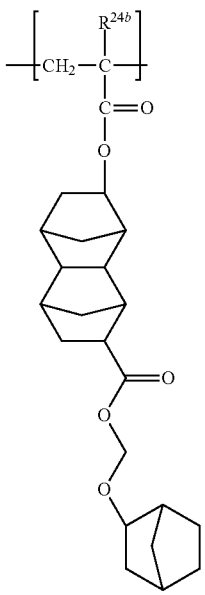
(b7-10)
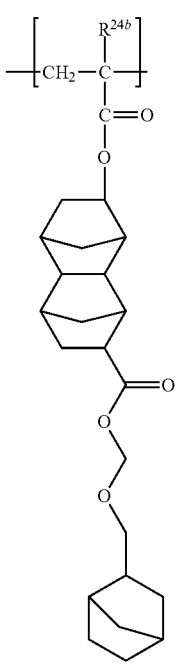
(b7-11)

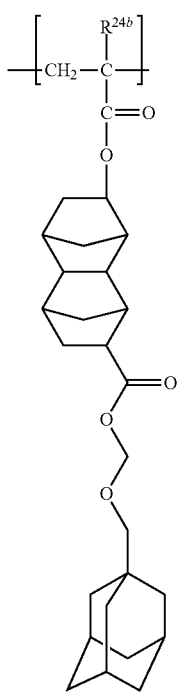
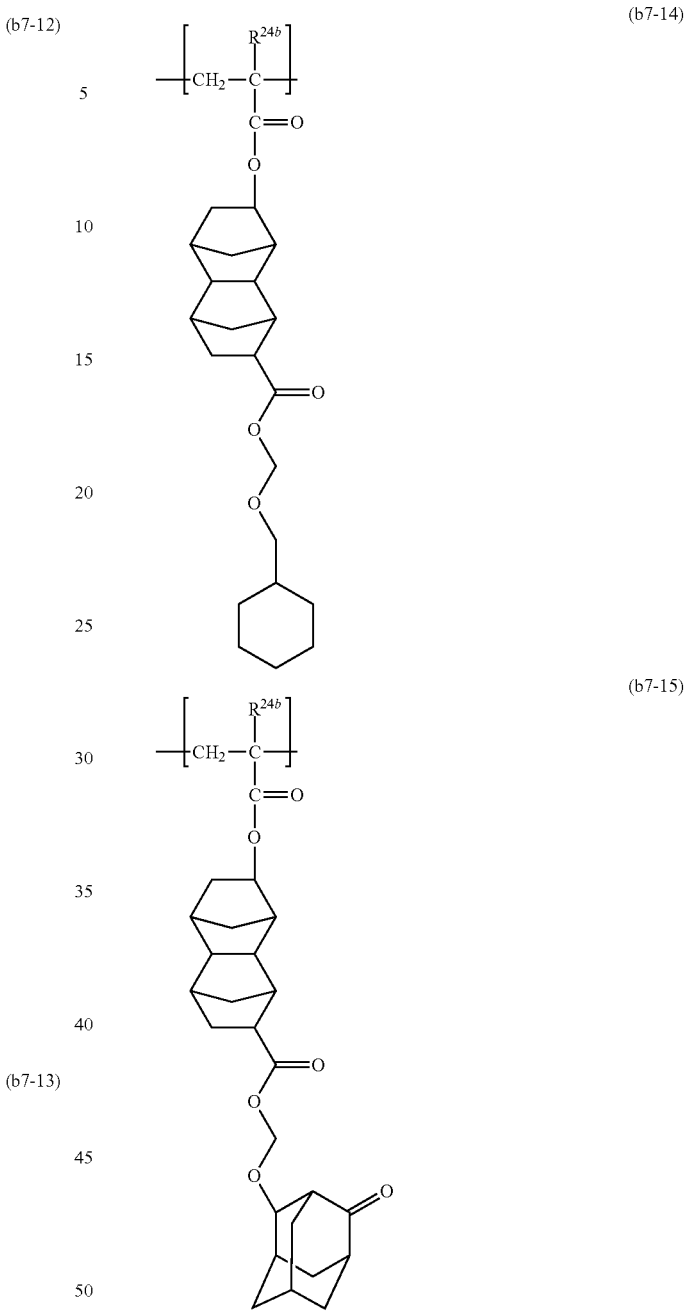

In the above formula (b7-1) to (b7-15), $R^{24b}$ represents a hydrogen atom or a methyl group.

Among the constituent units represented by the above-described formulae (b5) to (b7), from the viewpoint of easy synthesis and achieving relatively high sensitivity, the constituent unit represented by the formula (b6) is preferable. Furthermore, among the constituent unit represented by the formula (b6), a constituent unit in which $Y^b$ is an alkyl group is preferable. A constituent unit in which one or both of $R^{19b}$ and $R^{20b}$ are an alkyl group is preferable.

Furthermore, it is also preferred that the acrylic resin (B3) includes a copolymer containing a structural unit derived from a polymerizable compound having an ether bond in addition to the structural unit represented by the above formulae (b5) to (b7).

Examples of the polymerizable compound having an ether linkage include radical polymerizable compounds such as (meth)acrylic acid derivatives having an ether linkage and an ester linkage, and specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the polymerizable compound having an ether linkage is preferably, 2-methoxyethyl (meth)acrylate, 2-ethoxyethyl (meth)acrylate, or methoxytriethylene glycol (meth)acrylate. These polymerizable compounds may be used alone, or in combinations of two or more thereof.

Furthermore, the acrylic resin (B3) may contain another polymerizable compound as a structural unit in order to moderately control physical or chemical properties. The polymerizable compound is exemplified by conventional radical polymerizable compounds and anion polymerizable compounds.

Examples of the polymerizable compound include monocarboxylic acids such as acrylic acid, methacrylic acid and crotonic acid; dicarboxylic acids such as maleic acid, fumaric acid and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid and 2-methacryloyloxyethyl hexahydrophthalic acid; (meth)acrylic acid alkyl esters such as methyl(meth)acrylate, ethyl (meth)acrylate, butyl(meth)acrylate and cyclohexyl(meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

As mentioned above, acrylic resin (B3) may include a constituent unit derived from a polymerizable compound having a carboxy group, for example, the above-mentioned monocarboxylic acids and dicarboxylic acid. However, from the viewpoint of easily obtaining resist pattern including a nonresist section whose cross-sectional shape is excellent rectangular, the acrylic resin (B3) does not include substantially the constituent unit derived from a polymerizable compound including a carboxy group. Specifically, the rate of the constituent unit derived from a polymerizable compound having a carboxy group in the acrylic resin (B3) is preferably 20% by mass or less, more preferably 15% by mass or less, and particularly preferably 5% by mass or less. In acrylic resin (B3), acrylic resin including a relatively large amount of constituent unit derived from the a polymerizable compound having a carboxy group preferably include only a small amount of constituent unit derived from a polymerizable compound having a carboxy group or is used in combination with an acrylic resin that does not contain this constituent unit.

Furthermore, examples of the polymerizable compound include (meth)acrylic acid esters having a non-acid-dissociative aliphatic polycyclic group, and vinyl group-containing aromatic compounds. As the non-acid-dissociative aliphatic polycyclic group, particularly, a tricyclodecanyl group, an adamantyl group, a tetracyclododecanyl group, an isobornyl group, a norbornyl group, and the like are preferred from the viewpoint of easy industrial availability. These aliphatic polycyclic groups may have a linear or branched alkyl group having 1 or more and 5 or less carbon atoms as a substituent.

Specific examples of the (meth)acrylic acid esters having a non-acid-dissociative aliphatic polycyclic group include compounds having structures represented by the following formulae (b8-1) to (b8-5).

[Formula 37]

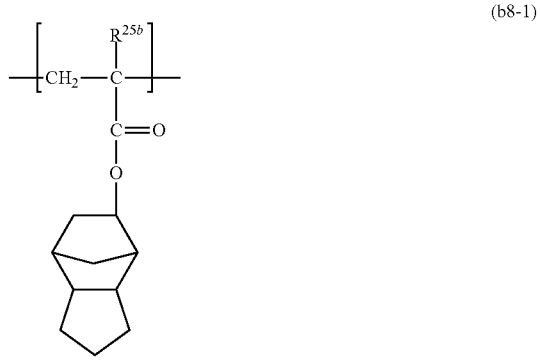
(b8-1)

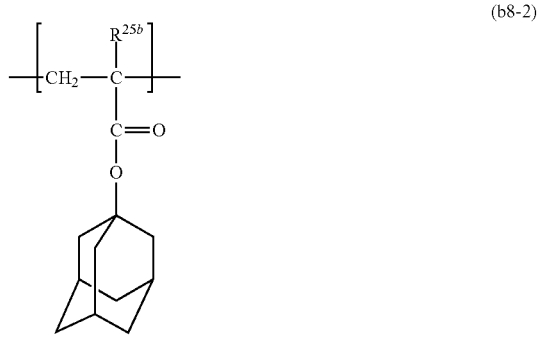
(b8-2)

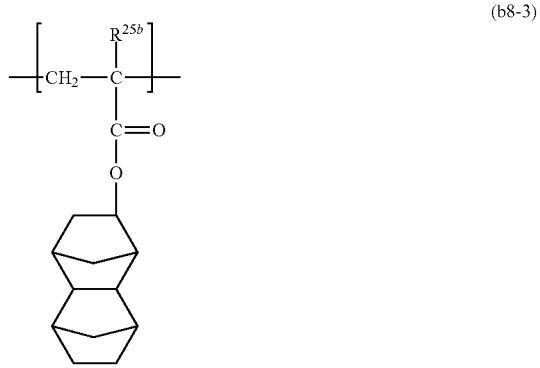
(b8-3)

-continued (b8-4)
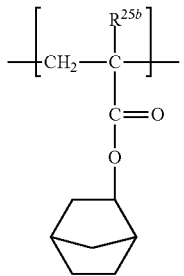

(b8-5)
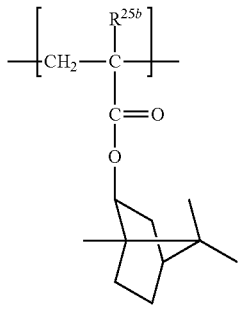

In formulae (b8-1) to (b8-5) $R^{25b}$ represents a hydrogen atom or a methyl group.

When the acrylic resin (B3) includes a constituent unit (b-3) including a cyclic group containing —$SO_2$— or a lactone-containing cyclic group, the content of the constituent unit (b-3) in the acrylic resin (B3) is preferably 5% by mass or more, more preferably 10% by mass or more, particularly preferably 10% by mass or more and 50% by mass or less, and most preferably 10% by mass or more and 30% by mass or less. When the photosensitive resin composition includes the above-mentioned range of amount of the constituent unit (b-3), both excellent developing property and excellent pattern shape can be obtained.

Furthermore, the acrylic resin (B3) includes preferably 5% by mass or more, more preferably 10% by mass or more, and particularly preferably 10% by mass or more and 50% by mass or less of the constituent unit represented by the above formulae (b5) to (b7).

The acrylic resin (B3) preferably include a constituent unit derived from a polymerizable compound including the above-mentioned ether bond. The content of the constituent unit derived from the polymerizable compound having ether bond in acrylic resin (B3) is preferably 0% by mass or more and 50% by mass or less, and more preferably 5% by mass or more and 30% by mass or less.

It is preferable that the acrylic resin (B3) includes a constituent unit derived from (meth)acrylic acid esters having the above-mentioned non-acid-dissociative aliphatic polycyclic group. The content of the constituent unit derived from (meth)acrylic acid esters including the non-acid-dissociative aliphatic polycyclic group in the acrylic resin (B3) is preferably 0% by mass or more and 50% by mass or less, and more preferably 5% by mass or more and 30% by mass or less.

As long as the photosensitive resin composition contains a predetermined amount of acrylic resin (B3), acrylic resin other than the above-described acrylic resin (B3) can be used as a resin (B). Such an acrylic resin other than the acrylic resin (B3) is not particularly limited as long as it is a resin containing constituent units represented by the above formulae (b5) to (b7).

The polystyrene equivalent mass average molecular weight of the above-described resin (B) is preferably 10,000 or more and 600,000 or less, more preferably 20,000 or more and 400,000 or less, and still more preferably 30,000 or more and 300,000 or less. With such mass average molecular weights, the photosensitive resin layer can maintain sufficient strength without deteriorating peel properties from the substrate, and also swelling of profiles in plating, and generation of cracks can be prevented.

Furthermore, it is preferable that the resin (B) has a dispersivity of no less than 1.05. Dispersivity herein denotes a value of a mass average molecular weight divided by a number average molecular weight. A dispersivity in the range described above can avoid problems with respect to stress resistance on intended plating or possible swelling of metal layers resulting from the plating process.

The content of the resin (B) is preferably 5% by mass or more and 60% by mass or less with respect to the total mass of the photosensitive resin composition according to the present invention.

Mercapto Compound (C)

The photosensitive resin composition contains the (C) mercapto compound represented by the following formula (C1). Therefore, when a resist pattern is formed using a photosensitive resin composition, the occurrence of footing and the occurrence of development residue are suppressed.

[Formula 38]

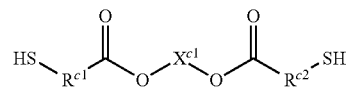

(C1)

(in the formula (C1), $R^{c1}$ and $R^{c2}$ each independently represent a divalent organic group, and the $R^{c1}$ and $R^{c2}$ are bonded to a carbonyl group by a C—C bond, and bonded to a mercapto group by a C—S bond, and $X^{c1}$ is a divalent organic group represented by the following formula (C1-1):

[Formula 39]

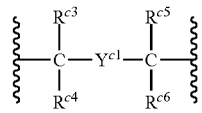

(C1-1)

In the formula (C1-1), $R^{c3}$, $R^{c4}$, $R^{c5}$, and $R^{c6}$ each independently represent a hydrocarbon group which may be have a substituent, $R^{c3}$ and $R^{c5}$, each may be bonded to a carbon atom in $Y^{c1}$ to form a ring, $Y^{c1}$ is a divalent organic group bonded by a C—C bond to a carbon atom to which $R^{c3}$ and $R^{c4}$ are bonded, as well as a carbon atom to which $R^{c5}$ and $R^{c6}$ are bonded.)

In $R^{c1}$ and $R^{c2}$, the divalent organic group may include a hetero atom. However, in a mercapto compound represented by the formula (C1), $R^{c1}$ and $R^{c2}$ are bonded to a carbonyl group by a C—C bond, and bonded to a mercapto group by a C—S bond. In other words, two atomic bonds of the divalent organic group are respectively bonded to carbon atoms in the divalent organic group. Furthermore, the divalent organic group may include an unsaturated bond.

Examples of the hetero atom which may be included in the divalent organic group include a halogen atom, an oxygen atom, a nitrogen atom, a phosphorus atom, and a silicon atom, and the like. The hetero atom may be present in the substituent bonded to a main skeleton of the divalent organic group, and may be present as a part of the bond constituting a divalent organic group.

Examples of the substituent including a hetero atom include a halogen atom, a hydroxyl group, a mercapto group, an alkoxy group, a cycloalkyloxy group, an aryloxy group, aralkyloxy group, an alkylthio group, a cycloalkylthio group, an arylthio group, aralkylthio group, an acyl group, an acyloxy group, an acylthio group, an alkoxycarbonyl group, a cycloalkyloxycarbonyl group, an aryloxycarbonyl group, an amino group, an N-monosubstituted amino group, an N,N-disubstituted amino group, a carbamoyl group (—CO—NH$_2$), an N-monosubstituted carbamoyl group, an N,N-disubstituted carbamoyl group, a nitro group, and a cyano group, and the like.

Specific examples of a halogen atom include a fluorine atom, a chlorine atom, a bromine atom, an iodine atom, and the like.

The number of carbon atoms of the alkoxy group is not particularly limited, but the number is preferably 1 or more and 6 or less, and more preferably 1 or more and 3 or less. The alkoxy group may be linear or may be branched. Specific examples of the alkoxy group include a methoxy group, an ethoxy group, an n-propyloxy group, an isopropyloxy group, an n-butyloxy group, an isobutyloxy group, a sec-butyloxy group, a tert-butyloxy group, an n-pentyloxy group, and an n-hexyloxy group.

The number of carbon atoms of the cycloalkyloxy group is not particularly limited, but the number is preferably 3 or more and 10 or less, and more preferably 3 or more and 8 or less. Specific examples of the cycloalkyloxy group include a cyclopropyloxy group, a cyclobutyloxy group, a cyclopentyloxy group, a cyclohexyloxy group, a cycloheptyloxy group, a cyclooctyloxy group, a cyclononyloxy group, and a cyclodecyloxy group.

The number of carbon atoms of the aryloxy group is not particularly limited, but the number is preferably 6 or more and 20 or less, and more preferably 6 or more and 12 or less. Specific examples of the aryloxy group include a phenoxy group, a naphthalene-1-yloxy group, a naphthalene-2-yloxy group, and biphenylyloxy group.

The number of carbon atoms of the aralkyloxy group is not particularly limited, but the number is preferably 7 or more and 20 or less, and more preferably 7 or more and 13 or less. Specific examples of the aralkyloxy group include a benzyloxy group, a phenethyloxy group, a naphthalene-1-ylmethoxy group, a naphthalene-2-ylmethoxy group, and the like.

The number of carbon atoms of the acyl group is not particularly limited, but the number is preferably 2 or more and 20 or less, and more preferably 2 or more and 11 or less. The acyl group may an aliphatic acyl group, or may be an aromatic acyl group containing an aromatic group. Specific examples of the acyl group include an acetyl group, a propionyl group, butanoyl group, a pentanoy group, a hexanoyl group, an octanoyl group, a nonanoyl group, a decanoyl group, a benzoyl group, a naphthalene-1-yl carbonyl group, a naphthalene-2-yl carbonyl group.

The number of carbon atoms of the acyloxy group is not particularly limited, but the number is preferably 2 or more and 20 or less, and more preferably 2 or more and 11 or less. The acyloxy group may an aliphatic acyloxy group, or may be an aromatic acyloxy group containing an aromatic group. Specific examples of the acyloxy group include an acetyloxy group, a propionyloxy group, a butanoyloxy group, a pentanoyloxy group, a hexanoyloxy group, octanoyloxy group, a nonanoyloxy group, a decanoyloxy group, a benzoyloxy group, a naphthalene-1-yl carbonyloxy group, and a naphthalene-2-ylcarbonyloxy group.

Suitable examples of an alkylthio group, a cycloalkylthio group, an arylthio group, an aralkylthio group, and an acylthio group include groups in which an oxygen atom is substituted with a sulfur atom in suitable groups as the alkoxy group, cycloalkoxy group, aryloxy group, aralkyloxy group, and acyloxy group.

The number of carbon atoms of the alkoxycarbonyl group is not particularly limited, but the number is preferably 2 or more and 7 or less, and more preferably 2 or more and 4 or less. The alkoxycarbonyl group may be linear or branched. Specific examples of the alkoxycarbonyl group include a methoxycarbonyl group, an ethoxycarbonyl group, n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, and an n-hexyloxycarbonyl group.

The number of carbon atoms of the cycloalkyloxycarbonyl group is not particularly limited, but the number is preferably 4 or more and 11 or less, and more preferably 4 or more and 9 or less. Specific examples of the cycloalkyloxycarbonyl group include a cyclopropyloxycarbonyl group, a cyclobutyloxycarbonyl group, a cyclopentyloxycarbonyl group, a cyclohexyloxycarbonyl group, a cycloheptyloxycarbonyl group, a cyclooctyloxycarbonyl group, a cyclononyloxycarbonyl group, and a cyclodecyloxycarbonyl group.

The number of carbon atoms of the aryloxycarbonyl group is not particularly limited, but the number is preferably 7 or more and 21 or less, and more preferably 7 or more and 13 or less. Specific examples of the aryloxycarbonyl group include a phenoxycarbonyl group, a naphthalene-1-yloxycarbonyl group, a naphthalene-2-yloxycarbonyl group, and a biphenylyloxycarbonyl group.

In the N-monosubstituted amino group and N,N-disubstituted amino group, the types of substituents bonded to a nitrogen atom are not particularly limited. Suitable examples of the substituents bonded to a nitrogen atom include an alkyl group having 1 or more and 6 or less carbon atoms which may be linear or branched, a cycloalkyl group having 3 or more and 10 or less carbon atoms, an aryl group having 6 or more and 20 or less carbon atoms, an aliphatic acyl group having 2 or more and 7 or less carbon atoms, and an aromatic acyl group having 7 or more and 21 or less carbon atoms. Suitable specific examples of the N-monosubstituted amino group include a methyl amino group, an ethyl amino group, an n-propyl amino group, an isopropyl amino group, an n-butyl amino group, an isobutyl amino group, a sec-butyl amino group, a tert-butyl amino group, an n-pentyl amino group, an n-hexyl amino group, a cyclopropyl amino group, a cyclobutyl amino group, a cyclopentyl amino group, a cyclohexyl amino group, a cycloheptyl amino group, a cyclooctyl amino group, a cyclononyl amino group, a cyclodecyl amino group, a phenyl amino group, a naphthalene-1-yl amino group, a naphthalene-2-yl amino group, a biphenylyl amino group, an acetyl amino group, a propionyl amino group, a butanoyl amino group, a pentanoyl amino group, a hexanoyl amino group, an octanoyl amino group, a nonanoyl amino group, a decanoyl amino group, a benzoyl amino group, a naphthalene-1-yl carbonyl amino group, and a naphthalene-2-yl carbonyl amino group. Suitable examples of the N,N-disubstituted amino group include a dimethyl amino group, a diethyl amino group, a di-n- propyl amino group, a diisopropyl amino group, a di-n-butyl amino group, a diisobutyl amino group, a di-sec-butyl amino group, a di-tert-butyl amino group, a di-n-pentyl amino group, a di-n-hexyl amino group, a dicyclopentyl amino group, a dicyclohexyl amino group, a diphenyl amino group, a diacetyl amino group, a dipropionyl amino group, and a dibenzoyl amino group.

In the N-monosubstituted carbamoyl group and N,N-disubstituted carbamoyl group, the types of substituents bonded to a nitrogen atom are not particularly limited. Suitable examples of the substituents bonded to a nitrogen atom are the same as those descried as to the N-monosubstituted amino group and N,N-disubstituted amino group. Suitable specific examples of the N-monosubstituted amino carbamoyl group includes an N-methyl carbamoyl group, an N-ethyl carbamoyl group, an N-n-propylcarbamoyl group, an N-isopropyl carbamoyl group, an N-n-butylcarbamoyl group, an N-isobutylcarbamoyl group, an N-sec-butylcarbamoyl group, an N-tert-butylcarbamoyl group, an N-n-pentyl carbamoyl group, an N-n-hexylcarbamoyl group, an N-cyclopropylcarbamoyl group, an N-cyclobutylcarbamoyl group, an N-cyclopentyl carbamoyl group, an N-cyclohexylcarbamoyl group, an N-cycloheptylcarbamoyl group, an N-cyclooctylcarbamoyl group, an N-cyclononylcarbamoyl group, an N-cyclodecylcarbamoyl group, an N-phenylcarbamoyl group, an N-naphthalene-1-ylcarbamoyl group, an N-naphthalene-2-ylcarbamoyl group, an N-biphenylylcarbamoyl group, an N-acetylcarbamoyl group, an N-propionylcarbamoyl group, an N-butanoylcarbamoyl group, an N-pentanoycarbamoyl group, an N-hexanoylcarbamoyl group, an N-octanoylcarbamoyl group, an N-nonanoylcarbamoyl group, an N-decanoylcarbamoyl group, an N-benzoyl carbamoyl group, an N-naphthalene-1-yl carbonyl carbamoyl group, and an N-naphthalene-2-yl carbonyl carbamoyl group. Suitable examples of the N,N-disubstituted carbamoyl group include an N,N-dimethyl carbamoyl group, an N,N-diethyl carbamoyl group, an N,N-di-n-propylcarbamoyl group, an N,N-di isopropyl carbamoyl group, an N,N-di-n-butylcarbamoyl group, an N,N-diisobutylcarbamoyl group, an N,N-di-sec-butylcarbamoyl group, an N,N-di-tert-butylcarbamoyl group, an N,N-di-n-pentyl carbamoyl group, an N,N-di-n-hexyl carbamoyl group, an N,N-dicyclopentyl carbamoyl group, an N,N-dicyclohexyl carbamoyl group, an N,N-diphenylcarbamoyl group, an N,N-diacetylcarbamoyl group, an N,N-dipropionylcarbamoyl group, and an N,N-dibenzoyl carbamoyl group.

In $R^{c1}$ and $R^{c2}$, specific examples of the bonds which may be included in the divalent organic group and which include a hetero atom include an ether bond, a thioether bond, a carbonyl bond, a thiocarbonyl bond, an ester bond, an amide bond, an urethane bond, an imino bond (—N=C(—R)—, —C(=NR)—: R represents a hydrogen atom or an organic group), a carbonate bond, a sulfonyl bond, a sulfinyl bond, an azo bond, and the like.

As $R^{c1}$ and $R^{c2}$, a hydrocarbon group having 1 or more and 20 or less carbon atoms is preferable. An alkylene group having 1 or more and 20 or less carbon atoms or a divalent aromatic hydrocarbon group having 6 or more and 20 or less carbon atoms are more preferable. An alkylene group having 1 or more and 20 or less carbon atoms is further preferable. An alkylene group having 1 or more and 10 or less carbon atoms is particularly preferable. An alkylene group having 1 or more and 6 or less carbon atoms is the most preferable. When $R^{c1}$ and $R^2$ are an alkylene group, the alkylene group may be a linear group or may be a branched group, and a linear group is preferable.

In $R^{c1}$ and $R^{c2}$, suitable specific examples of the divalent aromatic hydrocarbon group include a p-phenylene group, an m-phenylene group, a p-phenylene group, a naphthalene-2,6-diyl group, a naphthalene-2,7-diyl group, a naphthalene-1,4-diyl group, and a biphenyl-4,4'-diyl group. Among them, a p-phenylene group, an m-phenylene group, a naphthalene-2,6-diyl group, and a biphenyl-4,4'-diyl group are preferable, and p-phenylene group, a naphthalene-2,6-diyl group, and a biphenyl-4,4'-diyl group are more preferable.

As $R^{c1}$ and $R^{c2}$, suitable specific examples of the alkylene group include a methylene group, an ethane-1,2-diyl group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, and a decane-1,10-diyl group. Among them, a methylene group, an ethane-1,2-diyl group, a propane-1,3-diyl group, a butane-1,4-diyl group, a pentane-1,5-diyl group, a hexane-1,6-diyl group are preferable, and a methylene group, an ethane-1,2-diyl group, and a propane-1,3-diyl group are more preferable. An ethylene group is particularly preferable.

In the formula (C1), the linking group $X^{c1}$ is a divalent group represented by the above formula (C1-1). $Y^{c1}$ positioned in the center of the divalent group represented by the formula (C1-1) is a divalent organic group. $Y^{c1}$ is bonded, by a C—C bond, to a carbon atom to which $R^{c3}$ and $R^{c4}$ are bonded, and a carbon atom to which $R^{c5}$ and $R^{c6}$ are bonded, respectively. Therefore, both the carbon atoms to which $R^{c3}$, $R^{c4}$, and $Y^{c1}$ are bonded, and the carbon atoms to which $R^{c5}$, $R^{c6}$, and $Y^{c1}$ are bonded are tertiary carbon atoms. Consequently, in the mercapto compound represented by the following formula (C1), two ester bonds in a molecule are easily cleaved under the action of acid. Thus, when a coating film made of a photosensitive resin composition is exposed, a mercapto compound represented by the following formula (C1) is decomposed in an exposed portion, and at least one or preferably both of HS—$R^{c1}$—COOH and HS—$R^{c2}$—COOH are produced as aliphatic carboxylic acid substituted with a mercapto group.

Examples of the divalent organic group as $Y^{c1}$ include groups the same as those of $R^{c1}$ and $R^{c2}$. As $Y^{c1}$, an alkylene group or a divalent aromatic hydrocarbon group is preferable. Suitable specific examples of $Y^{c1}$, when it is an alkylene group or a divalent aromatic hydrocarbon group, are the same as the suitable specific examples of an alkylene group or a divalent aromatic hydrocarbon group for $R^{c1}$ and $R^{c2}$.

In the formula (C1-1), $R^{c3}$, $R^{c4}$, $R^{c5}$, and $R^{c6}$ each independently represent a hydrocarbon group which may have a substituent. $R^{c3}$ and $R^{c4}$ as well as $R^{c5}$ and $R^{c6}$ may be the same hydrocarbon group or may be a different hydrocarbon group, but they are preferably the same hydrocarbon group. The substituent which may be included in the hydrocarbon group are the same substituent which may be included in the divalent hydrocarbon group of $R^{c1}$ and $R^{c2}$.

As $R^{c3}$, $R^{c4}$, $R^{c5}$, and $R^{c6}$, an alkyl group, an alkenyl group, or an aromatic hydrocarbon group is preferable. The alkyl group may be a linear or branched alkyl group. The number of carbon atoms of the alkyl group is preferably 1 or more and 6 or less. Suitable examples of the alkyl group include a methyl group, an ethyl group, an n-propyl group, an isopropyl group, an n-butyl group, an isobutyl group, a sec-butyl group, a tert-butyl group, an n-pentyl group, and an n-hexyl group. The alkenyl group may be a linear or branched alkenyl group. The number of carbon atoms of the alkenyl group is preferably 2 or more and 6 or less. Suitable examples of the alkenyl group include a vinyl group, an allyl group (2-propenyl group), a 3-butenyl group, a 4-pentenyl group, and a 5-hexenyl group. The number of carbon atoms of the aromatic hydrocarbon group is preferably 6 or more and 20 or less, and more preferably 6 or more and 12 or less. Suitable examples of the aromatic hydrocarbon group include a phenyl group, a naphthalene-1-yl group, and a naphthalene-2-yl group.

As $R^{c3}$, $R^{c4}$, $R^{c5}$, $R^{c6}$, among the above-described groups, a methyl group, an ethyl group, an n-propyl group, an isopropyl group, an n-butyl group, an n-pentyl group, an n-hexyl group, a vinyl group, an allyl group, and a phenyl group are preferable, and a methyl group, an ethyl group, an n-propyl group, an isopropyl group, a vinyl group, and a phenyl group are more preferable.

Furthermore, in the formula (C1-1), $R^{c3}$ and $R^{c5}$ respectively may be bonded to a carbon atom to form a ring. In this case, one of $R^{c3}$ and $R^{c5}$ may form a ring together with a carbon atom in $Y^{c1}$ to form a ring, but preferably both of $R^{c3}$ and $R^{c5}$ form a ring together with a carbon atom in $Y^{c1}$ to form a ring. When $R^{c3}$ and/or $R^{c5}$ forms a ring together with a carbon atom in $Y^{c1}$, a carbon atom to which $R^{c3}$, $R^{c4}$, and $Y^{c1}$ are bonded, and a carbon atom to which $R^{c5}$, $R^{c6}$, and $Y^{c1}$ are bonded are both tertiary carbon atom, the ring is an aliphatic hydrocarbon ring without fail.

Specific examples of the aliphatic cyclic group include monocycloalkane rings and polycycloalkane rings such as a bicycloalkane ring, a tricycloalkane ring, and a tetracycloalkane ring. Specific examples thereof include monocycloalkane rings such as a cyclopentane ring, a cyclohexane ring, a cycloheptane ring, a cyclooctane ring, and polycycloalkane rings such as an adamantane ring, a norbornane ring, an isobornane ring, a tricyclodecane ring, and a tetracyclododecane ring. Among them, a cyclohexane ring, and an adamantane ring are preferable, and a cyclohexane ring is more preferable.

When both $R^{c3}$ and $R^{c5}$ form a ring together with a carbon atom in $Y^{c1}$, two aliphatic hydrocarbon rings are formed. Preferably, two aliphatic hydrocarbon rings are bonded to each other by a single bond or by an alkylene group having 1 or more and 6 or less carbon atoms. Among the alkylene groups having 1 or more and 6 or less carbon atoms, a methylene group, an ethane-1,2-diyl group, an ethane-1,1-diyl group, a propane-1,3-diyl group, a propane-2,2,-diyl group, a propane-1,1-diyl group, a butane-1,4-diyl group, a butane-1,1,-diyl group, a butane-2,2-diyl group, a pentane-1,5-diyl group, a pentane-1,1-diyl group, a pentane-2,2-diyl group, and a pentane-3,3-diyl group are preferable, and a methylene group, an ethane-1,2-diyl group, an ethane-1,1-diyl group, and a propane-2,2-diyl group are more preferable.

In the formula (C1-1), when $R^{c3}$ and $R^{c5}$ are respectively bonded to a carbon atom in $Y^{c1}$ to form a ring, suitable specific examples of the divalent groups represented by the formula (C1-1) include the following groups.

[Formula 40]

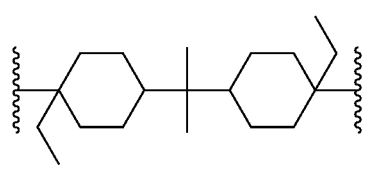

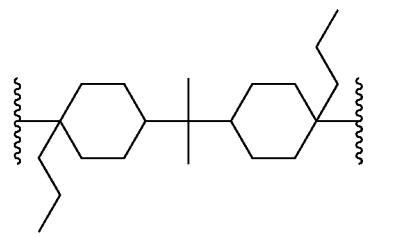

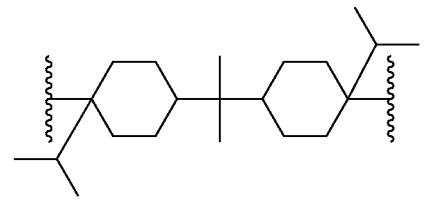

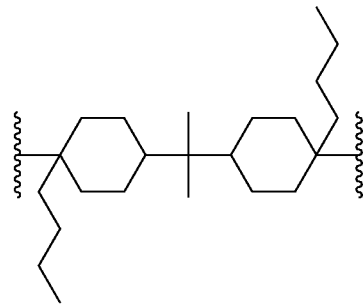

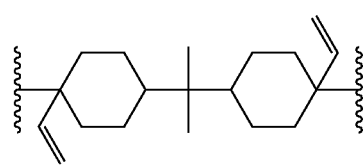

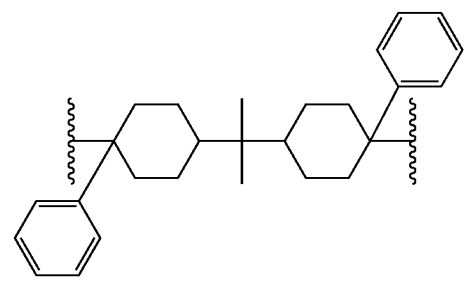

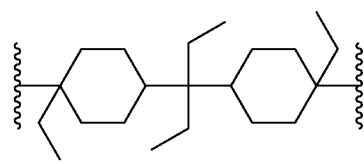

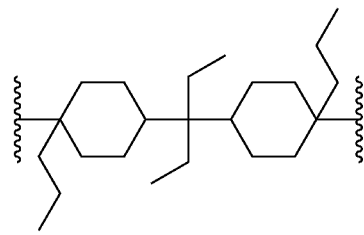

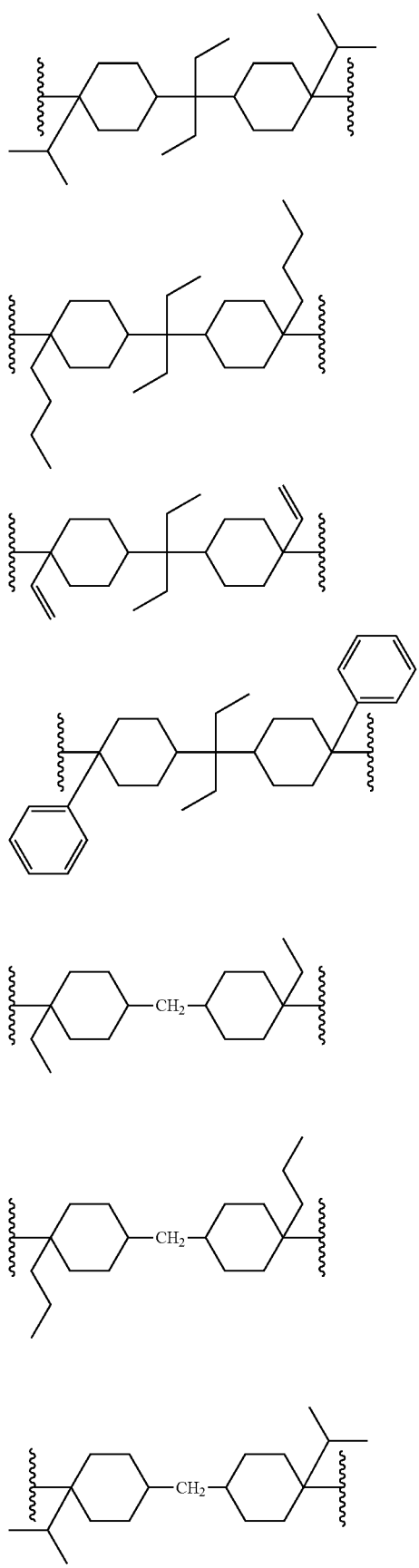
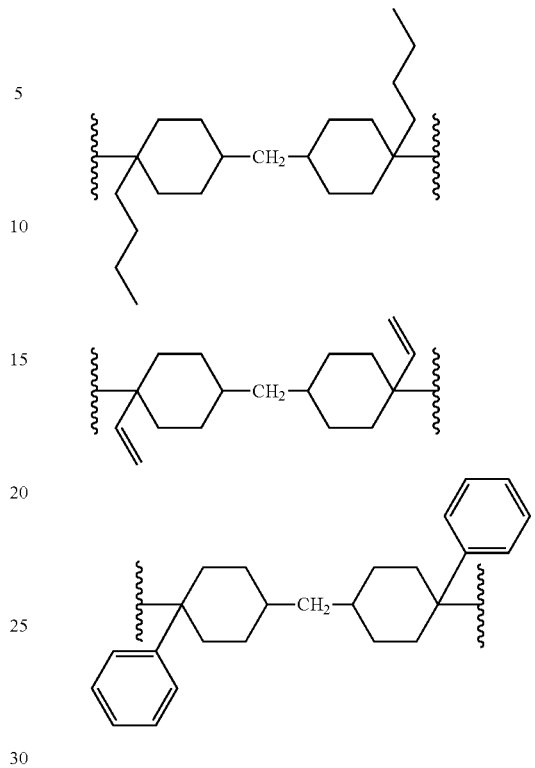
Suitable specific examples of the mercapto compound represented by the formula (C1) described above include the following compounds.
[Formula 41]
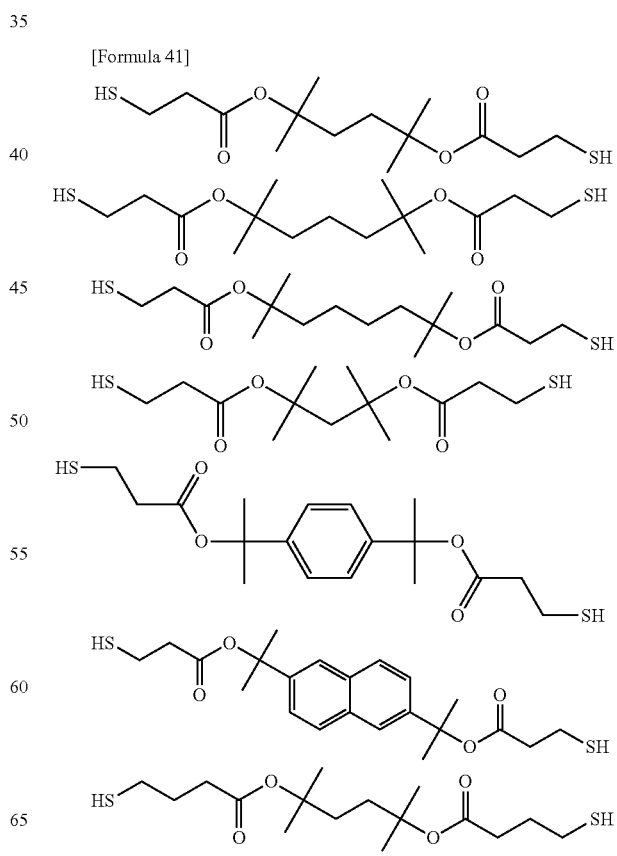

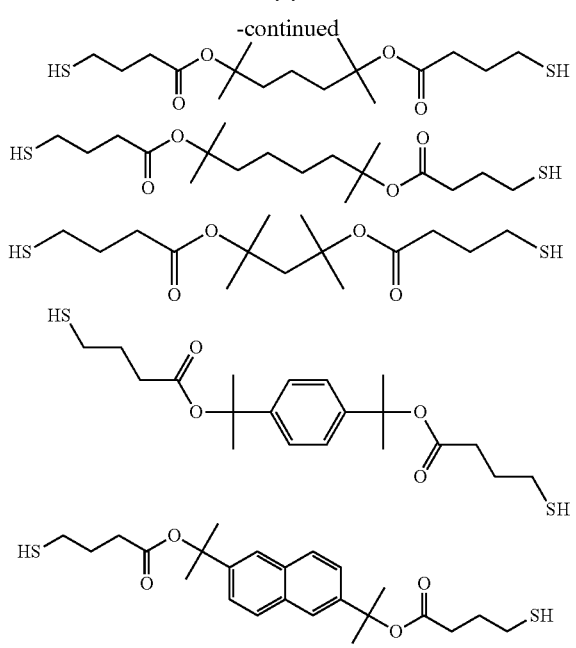

The mercapto compound (C) is preferably used in a range of 0.01 parts by mass or more and 5 parts by mass or less relative to the total mass of 100 parts by mass of the above resin (B) and the alkali soluble resin (D) described below, and in particular preferably in a range of 0.05 parts by mass or more and 2 parts by mass or less. When the addition amount of the mercapto compound (C) is 0.01 parts by mass or more, footing can be effectively suppressed. When the addition amount is 5 parts by mass or less, a good plated article can be formed.

When pattern formation is carried out by using a positive-type photosensitive resin composition including an acid generator (A) that generates an acid when irradiated with an active ray or radiation, and a resin (B) whose solubility in alkali increases under the action of acid, it is considered that acids generated from the acid generator (A) at the time of exposure are deactivated in the vicinity of the surface of the substrate. In particular, in the vicinity of the interface between an exposed portion and unexposed portion, in which the acid concentration is low, the footing tends to occur due to the influence of deactivation of acids on the surface of the substrate. In this respect, when the photosensitive composition includes a mercapto compound, deactivation of acids on the surface of the substrate is easily suppressed, resulting in easily suppressing the footing. However, the mercapto compound itself is less soluble in an alkali developing solution. Therefore, a problem may arise that residues easily occur at the time of development when the photosensitive composition includes a mercapto compound. In order to solve such a problem, it is possible that an alkali-soluble group such as a carboxy group is used as the mercapto compound. However, when a mercapto compound having an alkali-soluble group such as a carboxy group is blended with the photosensitive composition, unexposed portion in the coating film is also soluble in an alkali developing solution. This makes it difficult to form pattern of desired size depending on the amount of the mercapto compound to be used. As mentioned above, it has been difficult to form resist pattern having a desired size while both suppression of footing and suppression of generation of residues after development are achieved. However, use of the above-mentioned mercapto compound (C) that decomposed under the action of acid and generate carboxylic acid having a mercapto group enables resist pattern of a desired size to be formed while the suppression of footing and the suppression of the occurrence of residues after development are achieved. This is because the use of the mercapto compound (C) suppresses the footing, and the mercapto compound (C) becomes soluble in an alkali developing solution after exposure. Furthermore, the mercapto compound (C) has at least two mercapto groups in its molecule. Therefore, the mercapto compound (C) more remarkably easily adheres to the substrate surface as compared with the compound having only one mercapto group. For the above-mentioned reasons, it is considered that when a photosensitive composition including a mercapto compound (C) having two or more mercapto groups and which generates carboxylic acid having a mercapto group after exposure is performed, the occurrence of footing and the occurrence of development residues are remarkably suppressed.

Alkali-soluble Resin (D)

It is preferred that the photosensitive resin composition further contains an alkali-soluble resin (D) in order to improve crack resistance. The alkali-soluble resin as referred to herein may be determined as follows. A solution of the resin to give a resin concentration of 20% by mass (solvent: propylene glycol monomethyl ether acetate) is used to form a resin film having a thickness of 1 μm on a substrate, and immersed in an aqueous 2.38% by mass TMAH (tetramethylammonium hydroxide) solution for 1 min. When the resin was dissolved in an amount of no less than 0.01 μm, the resin is defined to be alkali soluble. The alkali-soluble resin (D) is preferably at least one selected from the group consisting of novolak resin (D1), polyhydroxystyrene resin (D2) and acrylic resin (D3).

Novolak Resin (D1)

The novolak resin (D1) may be prepared by addition condensation between, for example, aromatic compounds having a phenolic hydroxy group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the aldehydes include formaldehyde, furfural, benzaldehyde, nitrobenzaldehyde, acetaldehyde, and the like. The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, a hydrogen atom of a hydroxide group in the resins is substituted with other substituents, or bulky aldehydes are used.

The mass average molecular weight of the novolac resin (D1) is not particularly limited as long as the purpose of the present invention is not impaired, but the mass average molecular weight is preferably 1,000 or more and 50,000 or less.

Polyhydroxystyrene Resin (D2)

Examples of the hydroxystyrene compound to constitute the polyhydroxystyrene resin (D2) include p-hydroxystyrene, α-methylhydroxystyrene, α-ethylhydroxystyrene, and the like. Furthermore, the polyhydroxystyrene resin (D2) is preferably prepared to give a copolymer with a styrene resin. Examples of the styrene compounds to constitute such a styrene resin include styrene, chlorostyrene, chloromethylstyrene, vinyltoluene, α-methylstyrene, and the like.

The mass average molecular weight of the polyhydroxystyrene resin (D2) is not particularly limited as long as the purpose of the present invention is not impaired, but the mass average molecular weight is preferably 1,000 or more and 50,000 or less.

Acrylic Resin (D3)

It is preferred that the acrylic resin (D3) includes a structural unit derived from a polymerizable compound having an ether linkage and a structural unit derived from a polymerizable compound having a carboxyl group.

Examples of the polymerizable compound having an ether linkage include (meth)acrylic acid derivatives having an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The polymerizable compound having an ether linkage is preferably, 2-methoxyethyl acrylate, and methoxytriethylene glycol acrylate. These polymerizable compounds may be used alone, or in combinations of two or more.

Examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

The mass average molecular weight of the acrylic resin (D3) is not particularly limited as long as the purpose of the present invention is not impaired, but the mass average molecular weight is preferably 50,000 or more and 800,000 or less.

The content of alkali-soluble resin (D) is such that when the total amount of the resin (B) and the alkali-soluble resin (D) is taken as 100 parts by mass, the content is preferably 0 parts by mass or more and 80 parts by mass or less, and more preferably 0 parts by mass or more and 60 parts by mass or less. By setting the content of the alkali-soluble resin (D) to the range described above, there is a tendency for resistance to cracking to increase, and film loss at the time of development can be prevented.

Acid Diffusion Control Agent (E)

In order to improve the configuration of resist pattern used as a template, the post-exposure delay stability and the like, it is preferred that the photosensitive resin composition further contains an acid diffusion control agent (E). The acid diffusion control agent (E) is preferably an nitrogen-containing compound (E1), and an organic carboxylic acid (E2), or an oxo acid of phosphorus or a derivative thereof may be further included as needed.

Nitrogen-containing Compound (E1)

Examples of the nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methylmorpholine, piperazine, 1,4-dimethylpiperazine, 1,4-diazabicyclo[2.2.2]octane, pyridine and the like. These may be used alone, or in combinations of two or more thereof.

The nitrogen-containing compound (E1) may be used in an amount typically in the range of 0 pars by mass or more and 5 parts by mass or less, and particularly in the range of 0 parts by mass or more and 3 parts by mass or less, with respect to 100 parts by mass of total mass of the resin (B) and the alkali-soluble resin (D).

Organic Carboxylic Acid (E2) or Oxo Acid of Phosphorus or Derivative Thereof

Among the organic carboxylic acid (E2), or the oxo acid of phosphorus or the derivative thereof, specific preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is particularly preferred. These may be used alone, or in combinations of two or more thereof.

The organic carboxylic acid (E2), or the oxo acid of phosphorus or the derivative thereof may be used in an amount typically in the range of 0 parts by mass or more and 5 parts by mass or less, and particularly in the range of 0 parts by mass or more and 3 parts by mass or less, with respect to 100 parts by mass of total mass of the resin (B) and the alkali-soluble resin (D).

Moreover, in order to form a salt to allow for stabilization, the organic carboxylic acid (E2), or the oxo acid of phosphorus or the derivative thereof is preferably used in an amount equivalent to that of the nitrogen-containing compound (E1).

Organic Solvent (S)

The photosensitive resin composition contains an organic solvent (S). The type of the organic solvent (S) is not particularly limited as long as the purpose of the present invention is not impaired, and the organic solvent can be appropriately selected for use from the organic solvents that have been conventionally used in positive-type photosensitive resin compositions.

Specific examples of the organic solvent (S) include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, ethyl pyruvate, ethylethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate and 3-methyl-3-methoxybutyl acetate; aromatic hydrocarbons such as toluene and xylene; and the like. These may be used alone, or as a mixture of two or more thereof.

The content of the organic solvent (S) is not particularly limited as long as the purpose of the present invention is not impaired. When the photosensitive resin composition is used for a thick-film application in which a photosensitive resin layer obtainable by a spin-coating method or the like has a thickness of 10 µm or greater, it is preferable to use the organic solvent (S) to the extent that the solid concentration of the photosensitive resin composition is 30% by mass or more and 55% by mass or less.

Other Components

The photosensitive resin composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Further, the photosensitive resin composition may also contain an adhesive auxiliary agent in order to improve the adhesiveness between a template formed with the photosensitive resin composition and a metal substrate.

Also, the photosensitive resin composition may further contain a surfactant for improving coating characteristics, defoaming characteristics, leveling characteristics and the like. Specific examples of the surfactant include commercially available fluorochemical surfactants such as BM-1000 and BM-1100 (both manufactured by B.M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), but not limited thereto.

Additionally, in order to finely adjust the solubility in a developing solution, the photosensitive resin composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive resin composition may further contain a sensitizer for improving the sensitivity.

Method for Preparing Chemically Amplified Positive-type Photosensitive Resin Composition The chemically amplified positive-type photosensitive resin composition is prepared by mixing and stirring the above components by the common method. Devices which can be used for mixing and stirring the above components include dissolvers, homogenizers, 3-roll mills and the like. After uniformly mixing the above components, the resulting mixture may further be filtered through a mesh, a membrane filter and the like.

Method for Manufacturing Substrate with Template

There is no particular limitation for the method for forming a resist pattern serving as a template for forming a plated article on a metal surface of a substrate by using the aforementioned photosensitive resin composition. Suitable methods include a method for manufacturing a substrate with a template, the method including: laminating a photosensitive resin layer made of a photosensitive resin composition on a metal surface of a substrate, irradiating the photosensitive resin layer with an active ray or radiation to perform exposure, and developing the photosensitive resin layer after the exposure to create a template for forming a plated article.

There is no particular limitation for the substrate on which a photosensitive resin layer is laminated, and conventionally known substrates can be used. Examples include substrates for electronic part, substrates on which a predetermined wire pattern is formed and the like. Substrates having a metal surface are used as the above substrate. As metal species constituting a metal surface, copper, gold and aluminum are preferred, and copper is more preferred.

The photosensitive resin layer is laminated on a substrate, for example, as follows. That is, a liquid photosensitive resin composition is applied on a substrate, and then a solvent is removed by heating to form a photosensitive resin layer having a desired thickness. There is no particular limitation for the thickness of a photosensitive resin layer as long as it can form a resist pattern serving as a template which has a desired thickness. The thickness of the photosensitive resin layer is not particularly limited, but it is preferably 10 μm or more, more preferably 10 μm or more and 150 μm or less, in particular preferably 20 μm or more and 120 μm or less, and most preferably 20 μm or more and 100 μm or less.

As a method for applying a photosensitive resin composition onto a substrate, those such as the spin coating method, the slit coat method, the roll coat method, the screen printing method and the applicator method can be used. Pre-baking is preferably performed on a photosensitive resin layer. The conditions of pre-baking may differ depending on the components in a photosensitive resin composition, the blending ratio, the thickness of a coating film and the like, but they are usually about 2 minutes or longer and 60 minutes or shorter at 70° C. or higher and 150° C. or lower, preferably 80° C. or higher and 140° C. or lower.

The photosensitive resin layer formed as described above is selectively irradiated (exposed) with an active ray or radiation, for example, an ultraviolet radiation or visible light with a wavelength of 300 nm or more and 500 nm or less through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, and the like. The irradiation dose of the radiation may vary depending on the constituent of the photosensitive resin composition, the thickness of the photosensitive resin layer, and the like. For example, when an ultra-high-pressure mercury lamp is used, the dose may be 100 mJ/cm² or more and 10,000 mJ/cm² or less. Furthermore, the radiation include a ray which activates an acid generator (A) to generate an acid.

After the exposure, the diffusion of acid is promoted by heating the photosensitive resin layer using a known method to change the alkali solubility of the photosensitive resin layer at an exposed portion of the photosensitive resin film.

Subsequently, the exposed photosensitive resin layer is developed in accordance with a conventionally known method, and an unnecessary portion is dissolved and removed to form a predetermined resist pattern. At this time, an alkaline aqueous solution is used as a developing solution.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photosensitive resin composition, the thickness of the photosensitive resin layer, and the like. Usually, the developing time is 1 minutes or longer and 30 minutes or shorter. The method for the development may be any one of a liquid-filling method, a dipping method, a paddle method, a spray developing method, and the like.

After development, it is washed with running water for 30 seconds or longer and 90 seconds or shorter, and then dried with an air gun, an oven and the like. As described above, it is possible to manufacture a substrate with a template having a resist pattern serving as a template on a metal surface of a substrate.

Method for Manufacturing Plated Article

A conductor such as a metal may be embedded, by plating, into a nonresist section (a portion removed with a developing solution) in a template formed on a substrate with a template formed by the above-mentioned method to form a plated article, for example, like a contacting terminal such as a bump or a metal post. Note that there is no particular limitation for the method for plate processing, and various conventionally known methods can be used. As a plating liquid, in particular, a solder plating liquid, a copper plating liquid, a gold plating liquid and a nickel plating liquid are suitably used. Finally, the remaining template is removed with a stripping liquid and the like in accordance with a conventional method.

According to the above-mentioned method, a resist pattern serving a template is formed while suppressing the occurrence of "footing" in which the width of the bottom (the side proximate to the surface of a support) becomes narrower than that of the top (the side proximate to the surface of a resist layer) in a nonresist section, and the occurrence of development residues. By using a substrate having the thus manufactured template and in which footing is suppressed, a plated article having excellent adhesiveness to the substrate can be manufactured.

EXAMPLES

The present invention will be described below in more detail with reference to Examples. The present invention shall not be limited to these Examples.

Preparation Example 1

Synthesis of Mercapto Compound C1

In Preparation Example 1, a mercapto compound C1 having the following structure was synthesized.

[Formula 42]

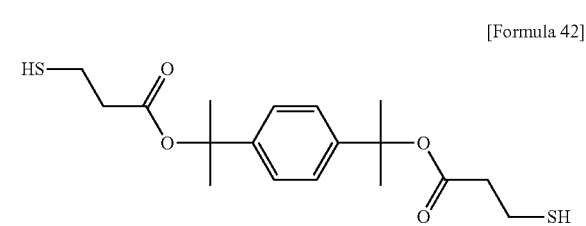 [SMILES: CC(C)(OC(=O)CCS)c1ccc(C(C)(C)OC(=O)CCS)cc1]

Under nitrogen atmosphere, 60 g of α,α'-dihydroxy-1,4-diisopropyl benzene, and 184 g of triethylamine were dissolved in 600 g of tetrahydrofuran in a reaction container. The content in the reaction container was cooled to 5° C. by ice bath. At the same temperature, 159 g of acryloylchloride was dropped into the reaction container over one hour. After dropping, the content in the reaction container was stirred and reacted at 25° C. for 15 hours. After reaction was finished, 752 g of saturated ammonium chloride aqueous solution was added to a reaction container. Then, the content was separated into an organic phase and a water phase. The organic phase was recovered. To the remaining water phase side, 1400 g of methyl-tert-butyl ether was added. The resultant mixture was separated into an organic phase and a water phase. The organic phase was recovered. The organic phase recovered at the first time and the organic phase recovered at the second time were mixed with each other, then the resultant organic phase was washed with pure water such that it became neutral, and a solvent was removed by evaporation using a rotary evaporator to obtain 47.94 g of α,α'-diacryloyloxy-1,4-diisopropyl benzene (yield: 50.6%). $^1$H-NMR measurement results of the product were as follows.
$^1$H-NMR (400 MHz, DMSO-d6)δ=7.30 (4H, S), 6.26 (4H, m), 5.90 (2H, dd), 1.73 (12H, s)

In the reaction container, 47.94 g of the resultant α,α'-diacryloyloxy-1,4-diisopropyl benzene and 48 g of thioacetic acid were dissolved in 283 g of tetrahydrofuran. The content in the reaction container was heated at 40° C., and then stirred for 8 hours to be reacted. After reaction was finished, a solvent was removed by evaporation from the content in the reaction container using a rotary evaporator to obtain 23.46 g (yield 32.6%) of solid product (α,α'-di(3-acetylthiopropionyl)oxy-1,4-diisopropyl benzene). $^1$H-NMR measurement results of the product were as follows.
$^1$H-NMR (400 MHz, DMSO-d6)δ=7.31 (4H, S), 3.00 (4H, t), 2.52 (4H, t), 2.33 (3H, s), 1.69 (12H, s)

In the reaction container, 22.30 g of the resultant α,α'-di (3-acetylthiopropionyl)oxy-1,4-diisopropyl benzene was dispersed in 15 g of methanol and then 21 g of concentration of 28% by mass aqueous ammonia solution was added thereto. The content in the reaction container was stirred at 25° C. for 7 hours to be reacted. After reaction was finished, 31 g of acetic acid and 400 g of ethyl acetate were added into the reaction container. Then, the content was separated into an organic phase and a water phase. The organic phase was recovered. The organic phase was washed with pure water such that it became neutral, and a solvent was removed by evaporation using a rotary evaporator to obtain a mixture of the mercapto compound C1 and a disulfide product thereof. In the reaction container, 18.37 g of the resultant mixture, 3.068 g of triethylamine, and 3.008 g of dithiothreitol were dissolved in 180 g of methylene chloride, and then the content in the reaction container was stirred at 25° C. for 12 hours. After stirring, 3.61 g of acetic acid and 200 g of pure water were added into the reaction container. Thereafter, the content was separated into an organic phase and a water phase. The organic phase was recovered. The organic phase was washed with pure water such that it became neutral, and a solvent was removed by evaporation using a rotary evaporator to obtain 17.54 g of mercapto compound C1 (yield: 95.3%). $^1$H-NMR measurement results of the product were as follows.
$^1$H-NMR (400 MHz, DMSO-d6)δ=7.33 (4H, S), 2.62 (8H, m), 2.41 (2H, t), 1.70 (12H, s)

Preparation Example 2

Synthesis of Mercapto Compound C2

In Preparation Example 2, 4.40 g of mercapto compound C2 having the following structure was obtained in the same manner as in Preparation Example 1 except that α,α'-dihydroxy-1,4-diisopropyl benzene was changed to 2,5-dihydroxy-2,5-dimethylhexane. $^1$H-NMR measurement results of the product were as follows.
$^1$H-NMR (400 MHz, CDCl$_3$)δ=4.38 (2H, br), 2.74 (4H, t), 1.91 (4H, s), 1.49 (12H, s)

[Formula 43]

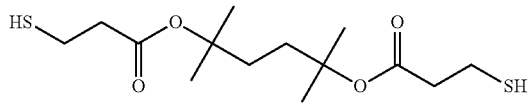

Examples 1 to 4 and Comparative Examples 1 to 5

In Examples and Comparative Examples, a compound represented by the following formula was used as an acid generator (A).

[Formula 44]

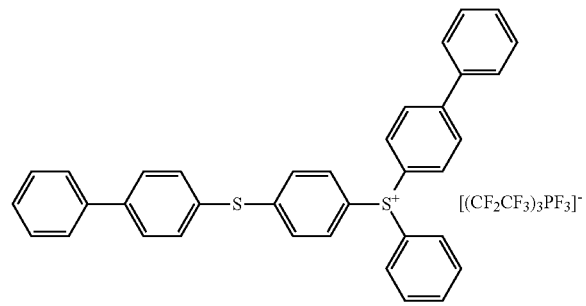

In Examples and Comparative Examples, the following resins B1 and B2 were used as the resin (a resin (B)) whose solubility in alkali increases under the action of acid. The number at the lower right of the parentheses in each constituent unit which the resin in the following structural formula represents the content (% by mass) of the constituent unit in each resin.

[Formula 45]

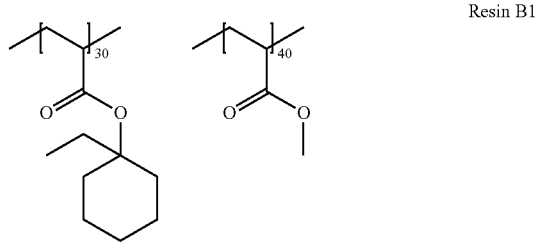

Resin B1

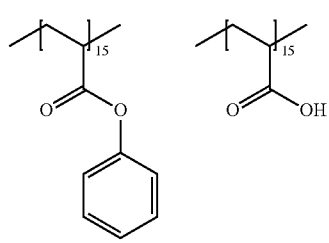

Resin B2

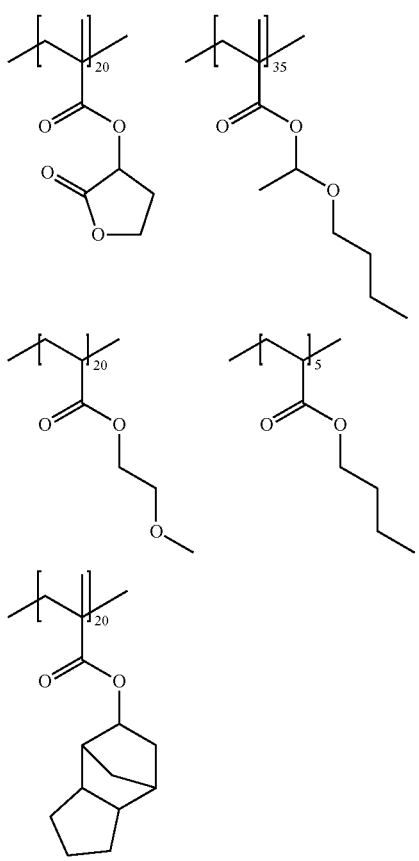

As the mercapto compound (C), the below described mercapto compounds C1 to C7 were used. As the mercapto compounds C1 and C2, the compounds obtained in the above Preparation Examples 1 and 2 were used.

[Formula 46]

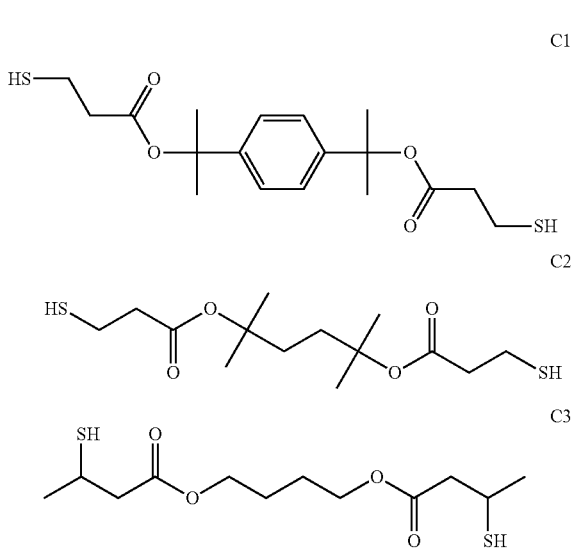

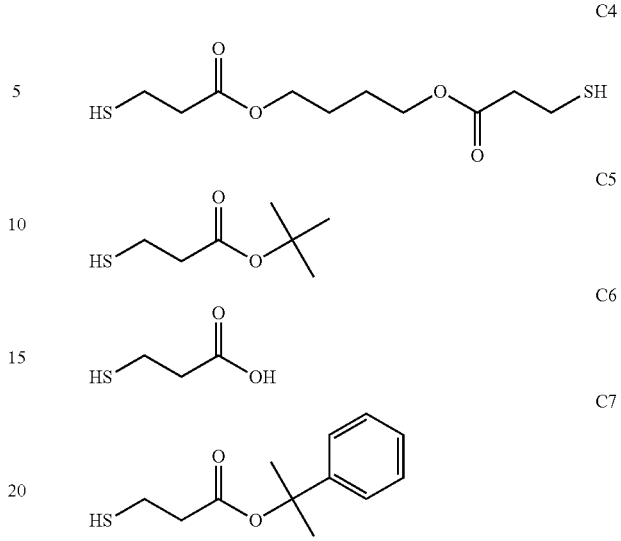

The following resins D1 and D2 were used as the alkali soluble resins (D).

D1: polyhydroxystyrene resin (copolymer of p-hydroxystyrene: styrene=85:15 (mass ratio), mass average molecular weight (Mw): 2500)

D2: novolak resin (m-cresol single condensation product (mass average molecular weight (Mw): 8000)

The resin (B), the mercapto compound (C), and the alkali soluble resin (D) in types and amounts described in Table 1, as well as 2.0 parts by mass of acid generator (A), and 0.02 parts by mass of tripentyl amine were dissolved in methoxy butyl acetate such that the solid content concentration became 53% by mass to obtain photosensitive resin compositions of Examples and Comparative Examples. Note here that the used amount of the mercapto compound (C) described in Table 1 is mass percent with respect to the total mass of the resin (B) and the alkali soluble resin (D).

The footing and the development residue were evaluated according to the method using resultant photosensitive resin composition was used. These evaluation results are shown in Table 1.

Evaluation of Footing

The photosensitive resin compositions from Examples and Comparative Examples were each applied on a copper substrate with a diameter of 8 inches to form a photosensitive resin layer having a thickness of 55 μm. Then the photosensitive resin layers were pre-baked for 5 minutes at 100° C. After the pre-baking, using a mask having a square pattern with a diameter of 30 μm and an exposure device Prisma GHI (Ultratech Inc.), pattern exposure was performed with the ghi line at an exposure level greater by 1.2 times than the minimum exposure level capable of forming a pattern having a predetermined size. Subsequently, the substrate was mounted on a hot plate to perform post-exposure baking (PEB) for 3 minutes at 140° C. Then, a 2.38 weight % aqueous solution of tetramethylammonium hydroxide (a developing solution, NMD-3, Tokyo Ohka Kogyo Co., Ltd.) was added dropwise to the exposed photosensitive resin layer, and allowed to stand for 60 seconds at 23° C. This was repeated the total of 4 times. Subsequently, the surface of the resist pattern was washed with running water, and blown with nitrogen to obtain a resist pattern. The cross-sectional shape of this resist pattern was observed under a scanning electron microscope to measure the amount of footing. Specifically, the amount of footing was measured as follows. FIG. 1 shows schematically illustrated cross-sections of a resist section and a nonresist section when measuring the amount of footing. In FIG. 1, a resist pattern having a resist section 12 and a nonresist section 13 (hole) is formed on a substrate 11. Firstly, an inflexion point 15 at which footing on a side wall 14 starts was determined on the side wall 14 which is the interface between the resist section 12 and the nonresist section 13. A perpendicular line 16 was drawn down from the inflexion point 15 toward the surface of the substrate 11, and the intersection of the perpendicular line 16 and the surface of the substrate 11 was taken as a starting point of footing 17. Further, the intersection of the curve of the side wall 14 and the surface of the substrate 11 was taken as an endpoint of footing 18. A width Wf between the starting point of footing 17 and the endpoint of footing 18 defined as above was taken as the amount of footing. The amount of footing is a value measured for any one of the side walls 14 at any one of the nonresist sections in the resist pattern. The degree of footing was evaluated in accordance with the following criteria based on the obtained value for the amount of footing.

Criteria for Footing Evaluation
A: 0 μm or more and 1.5 μm or less
B: more than 1.5 μm and 2.5 μm or less
C: more than 2.5 μm Evaluation of Development Residue The photosensitive resin compositions of Examples and Comparative Examples were each applied on a copper substrate having a diameter of 8 inch to form a photosensitive resin layer having a thickness of 55 μm. The entire surface of the photosensitive resin layer was exposed in the same conditions as those for evaluation of footing, and developed. The surface of the developed substrate was observed by visual observation. The case where coloring was not observed on the surface of the substrate was evaluated as "O", and the case where coloring was not observed on the surface of the substrate was evaluated as "X".

TABLE 1

| | Resin (B) Types/part(s) by mass | Alkali soluble resin (D) Types/part(s) by mass | Mercapto compound (C) Types/% by mass | Footing | Development residue |
|---|---|---|---|---|---|
| Example 1 | B1/40 | D1/20 D2/40 | C1/0.10 | A | A |
| Example 2 | B1/40 | D1/20 D2/40 | C2/0.10 | A | A |
| Example 3 | B2/100 | — | C1/0.10 | A | A |
| Example 4 | B2/100 | — | C2/0.10 | A | A |
| Comparative Example 1 | B1/40 | D1/20 D2/40 | C3/0.10 | A | C |
| Comparative Example 2 | B1/40 | D1/20 D2/40 | C4/0.10 | A | C |
| Comparative Example 3 | B1/40 | D1/20 D2/40 | C5/0.10 | B | A |
| Comparative Example 4 | B1/40 | D1/20 D2/40 | C6/0.10 | C | A |
| Comparative Example 5 | B1/40 | D1/20 D2/40 | C7/0.10 | B | A |
| Comparative Example 6 | B2/100 | — | C3/0.10 | A | C |
| Comparative Example 7 | B2/100 | — | C5/0.10 | B | C |

Examples 1 to 4 reveal that the occurrence of footing and the occurrence of development residue in a resist pattern can be suppressed when the resist pattern is formed with a positive-type photosensitive resin composition comprising the acid generator (A) capable of producing an acid when irradiated with an active ray or radiation and the resin (B) whose solubility in alkali increases under the action of acid as well as the mercapto compound (C) represented by the aforementioned formula (C1).

On the other hand, according to Comparative Examples 1 to 7, it is shown that when a positive-type photosensitive resin composition includes a mercapto compound (C) having a structure other than the structure represented by the formula (C1), it is difficult to achieve both suppression of the occurrence of footing and suppression of the occurrence of development residue.

EXPLANATION OF REFERENCE NUMERALS

11 Substrate
12 Resist section
13 Nonresist section
14 Side wall
15 Inflexion point
16 Perpendicular line
17 Starting point of footing
18 Endpoint of footing

What is claimed is:
1. A chemically amplified positive photosensitive resin composition, comprising:
an acid generator (A) that generates an acid when irradiated with an active ray or radiation;
a resin (B) whose solubility in alkali increases under an action of acid; and
a mercapto compound (C) represented by the following formula (C1):

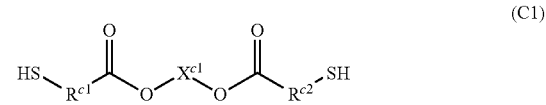

(C1)

wherein $R^{c1}$ and $R^{c2}$ each independently represents a divalent organic group, the $R^{c1}$ and $R^{c2}$ are bonded to a carbonyl group by a C—C bond, and bonded to a mercapto group by a C—S bond, $X^{c1}$ is a divalent organic group represented by the following formula (C1-1):

(C1-1)

wherein $R^{c3}$, $R^{c4}$, $R^{c5}$, and $R^{c6}$ each independently represents a hydrocarbon group optionally having a substituent, $R^{c3}$ and $R^{c5}$ respectively may be bonded to a carbon atom in $Y^{c1}$ to form a ring, $Y^{c1}$ represents a divalent organic group bonded, by a C—C bond, to a carbon atom to which $R^{c3}$ and $R^{c4}$ are bonded and to a carbon atom to which $R^{c5}$ and $R^{c6}$ are bonded, respectively.

2. The chemically amplified positive photosensitive resin composition according to claim 1, wherein the $Y^{c1}$ is an alkylene group or a divalent aromatic hydrocarbon group.

3. The chemically amplified positive photosensitive resin composition according to claim 1, further comprising an alkali soluble resin (D).

4. The chemically amplified positive photosensitive resin composition according to claim 3, wherein the alkali soluble resin (D) includes at least one resin selected from the group consisting of a novolak resin (D1), a polyhydroxystyrene resin (D2), and an acrylic resin (D3).

5. A method for manufacturing a substrate with a template, the method comprising:
- laminating a photosensitive resin layer made of the chemically amplified positive photosensitive resin composition according to claim 1 on the metal surface of a substrate;
- irradiating the photosensitive resin layer with an active ray or radiation to perform exposure; and
- developing the photosensitive resin layer after the exposure to create a template for forming a plated article.

6. A method for manufacturing a plated article, the method comprising plating the substrate with the template manufactured by the method according to claim 5 to form the plated article in the template.

* * * * *